US012648173B2

(12) United States Patent
Chiang et al.

(10) Patent No.: US 12,648,173 B2
(45) Date of Patent: Jun. 2, 2026

(54) SEMICONDUCTOR DEVICE AND MANUFACTURING METHOD THEREOF

(71) Applicant: Hon Young Semiconductor Corporation, Hsinchu City (TW)

(72) Inventors: Kuang-Hao Chiang, Hsinchu City (TW); Yan-Ru Chen, Hsinchu City (TW)

(73) Assignee: Hon Young Semiconductor Corporation, Hsinchu City (TW)

( * ) Notice: Subject to any disclaimer, the term of this patent is extended or adjusted under 35 U.S.C. 154(b) by 512 days.

(21) Appl. No.: 18/170,517

(22) Filed: Feb. 16, 2023

(65) Prior Publication Data

US 2024/0079489 A1     Mar. 7, 2024

(30) Foreign Application Priority Data

Sep. 1, 2022     (TW) .................................. 111133226

(51) Int. Cl.
H10D 30/66         (2025.01)
H10D 30/01         (2025.01)
H10D 62/10         (2025.01)

(52) U.S. Cl.
CPC ......... H10D 30/66 (2025.01); H10D 30/0291 (2025.01); H10D 62/107 (2025.01)

(58) Field of Classification Search
CPC ... H10D 30/0291; H10D 30/66; H10D 62/107
See application file for complete search history.

(56) References Cited

U.S. PATENT DOCUMENTS

| | | | |
|---|---|---|---|
| 2014/0353686 A1 | 12/2014 | Miura et al. | |
| 2015/0001549 A1 | 1/2015 | Miura et al. | |
| 2019/0189756 A1 | 6/2019 | Okumura | |
| 2023/0246073 A1* | 8/2023 | Harrington, III .... | H10D 62/112 |
| | | | 257/77 |

FOREIGN PATENT DOCUMENTS

CN          114175266 A        3/2022

* cited by examiner

*Primary Examiner* — Daniel P Shook
(74) *Attorney, Agent, or Firm* — CKC & Partners Co., LLC

(57)          ABSTRACT

A semiconductor device includes a substrate, an epitaxial layer, a well region, a current spreading layer, a source region, a base region and a gate layer. The epitaxial layer is on the substrate. The well region is in the epitaxial layer. The current spreading layer is in the epitaxial layer and below the well region. The current spreading layer includes a plurality of the first doped regions and a plurality of the second doped regions, the first doped regions includes a plurality of dopants of the first semiconductor-type, the second doped regions includes a plurality of dopants of the second semi-conductor-type, and the second semiconductor-type is dif-ferent from the first semiconductor-type. The source region is in the well region. The base region is in the well region and adjacent to the source region. The gate layer is over the epitaxial layer.

9 Claims, 30 Drawing Sheets

<u>100</u>

SEMICONDUCTOR DEVICE AND MANUFACTURING METHOD THEREOF

CROSS-REFERENCE TO RELATED APPLICATION

This application claims priority to Taiwan Application Serial Number 111133226, filed Sep. 1, 2022, which is herein incorporated by reference in its entirety.

BACKGROUND

Field of Invention

The present disclosure relates to a semiconductor device and a manufacturing method thereof.

DESCRIPTION OF RELATED ART

Power devices, such as metal oxide semiconductor field-effect transistors (MOSFET), may include gates, sources, and drains. When providing voltages to the gate, electrons may flow from the source through the channel to the drain. When the channel is horizontal, the path of the electron flow tends to be restricted. The current of the semiconductor device becomes weaker, and the conversion efficiency is not high.

SUMMARY

Some embodiments of the present disclosure of a semiconductor device includes a substrate, an epitaxial layer, a well region, a current spreading layer, a source region, a base region and a gate layer. The epitaxial layer is on the substrate. The well region is in the epitaxial layer. The current spreading layer is in the epitaxial layer and below the well region. The current spreading layer includes a plurality of the first doped regions and a plurality of the second doped regions, the first doped regions includes a plurality of dopants of a first semiconductor-type, the second doped regions includes a plurality of dopants of a second semiconductor-type, and the second semiconductor-type is different from the first semiconductor-type. The source region is in the well region. The base region is in the well region and adjacent to the source region. The gate layer is over the epitaxial layer.

In some embodiments, a distance is between the second doped regions and the well region.

In some embodiments, a plurality of top portions of the first doped regions upwardly protrude from a plurality of top portions of the second doped regions.

In some embodiments, widths of the first doped regions decrease as getting close to the well region.

In some embodiments, a plurality of bottom portions of the first doped regions are leveled with a plurality of bottom portions of the second doped regions.

Some embodiments of the present disclosure provide a semiconductor device including a substrate, an epitaxial layer, a well region, a current spreading layer, a source region, a base region and a gate layer. The epitaxial layer is on the substrate, wherein the epitaxial layer includes a drift region, and the drift region has a plurality of dopants of a first semiconductor-type. The well region is in the epitaxial layer and cladded by the epitaxial layer. The current spreading layer is in the epitaxial layer. Compared to the substrate, the current spreading layer is closer to the well region, the current spreading layer includes a doped region having a plurality of dopants of a second semiconductor-type and a plurality of conductive materials, and the conductive materials are arranged in the doped region. The source region is in the well region. The base region is in the well region. The gate layer is over the current spreading layer.

In some embodiments, the conductive materials are a plurality of the metals.

In some embodiments, the conductive materials are a plurality of the carbon nanotubes.

In some embodiments, a distance is between the conductive materials in adjacent positions.

In some embodiments, a top portion of at least one of the conductive materials upwardly protrudes from a top portion of the doped region.

Some embodiments of the present disclosure provide a manufacturing method of forming a semiconductor device including forming an epitaxial layer on a substrate, forming a well region in the epitaxial layer, forming a source region in the well region, forming a base region in the source region, forming a gate dielectric layer and a gate layer on the epitaxial layer, forming a source contact on the source region and the base region, removing the substrate and a portion of the epitaxial layer, forming a current spreading layer at a bottom of the epitaxial layer; and disposing a replacement epitaxial layer and a replacement substrate under the current spreading layer.

In some embodiments, forming the current spreading layer at the bottom of the epitaxial layer includes performing a P-type ion implantation from the bottom of the epitaxial layer to form a P-type doped region at the bottom of the epitaxial layer, and performing an N-type ion implantation from the bottom of the epitaxial layer to form N-type doped regions. The N-type doped regions are arranged in the P-type doped region.

In some embodiments, widths of the N-type doped regions close to the well region are smaller than the widths of the N-type doped regions far away from the well region.

In some embodiments, forming the current spreading layer at the bottom of the epitaxial layer includes performing a P-type ion implantation from the bottom of the epitaxial layer to form a P-type doped region at the bottom of the epitaxial layer, performing an etching process to form openings in the P-type doped region, and forming conductive materials in the openings.

In some embodiments, bottoms of the openings are connected together

In some embodiments, forming the current spreading layer at the bottom of the epitaxial layer includes coating a nanometer-sized metal particle solution on a surface of the epitaxial layer, and the nanometer-sized metal particle solution comprises conductive materials. An epitaxial growth process is performed, so that the conductive materials are covered by the epitaxial layer. The processes of coating the nanometer-sized metal particle solution and performing the epitaxial growth process are repeated, so that the conductive materials are arranged in rows in the epitaxial layer. A P-type ion implantation is performed to form a P-type doped region, wherein top portions of the conductive materials protrude from the top portion of the P-type doped region.

In some embodiments, forming the current spreading layer at the bottom of the epitaxial layer includes growing conductive materials on a surface of the epitaxial layer. An epitaxial growth process is performed, so that the conductive materials are covered by the epitaxial layer. The processes of growing the conductive materials and performing the epitaxial growth process are repeated, so that the conductive materials are arranged in rows in the epitaxial layer. A P-type ion implantation is performed to form a P-type doped region, wherein top portions of the conductive materials protrude from the top portion of the P-type doped region.

In some embodiments, the manufacturing method further includes forming a drain electrode under the replacement substrate.

In some embodiments, after forming the source contact, the manufacturing method further includes forming a dielectric layer on the gate dielectric layer and the gate layer, and forming an interconnection structure in the dielectric layer. The interconnection structure is in contact with the source contact.

In some embodiments, after forming the source contact, the manufacturing method further includes forming a carrier on the dielectric layer and the interconnection structure.

Some embodiments of the present disclosure provide some advantages. Using the coolant gas provided at the backside of the lid can make the temperature gradient of the seed layer and the portion of the semiconductor material layer increase. As such, defects which are formed due to internal stress are easily formed at the seed layer and in the portion of the semiconductor material layer near the seed layer, such that the defects do not extend downwards to the semiconductor material layer to destroy uniformity of the single crystal in the semiconductor material layer.

Some embodiments of the present disclosure are related to a current spreading layer. Specifically, the current spreading layer may be used to expand the restricted area of the electron flow, so that the electronic current does not concentrate in a certain area.

It is to be understood that both the foregoing general description and the following detailed description are by examples, and are intended to provide further explanation of the description as claimed.

DETAILED DESCRIPTION

Some embodiments of the present disclosure are related to a current spreading layer. Specifically, the current spreading layer may be used to expand the restricted area of the electron flow, so that the electronic current does not concentrate in a certain area. Some embodiments of the present disclosure provide different types of the current spreading layers.

Figure 1:
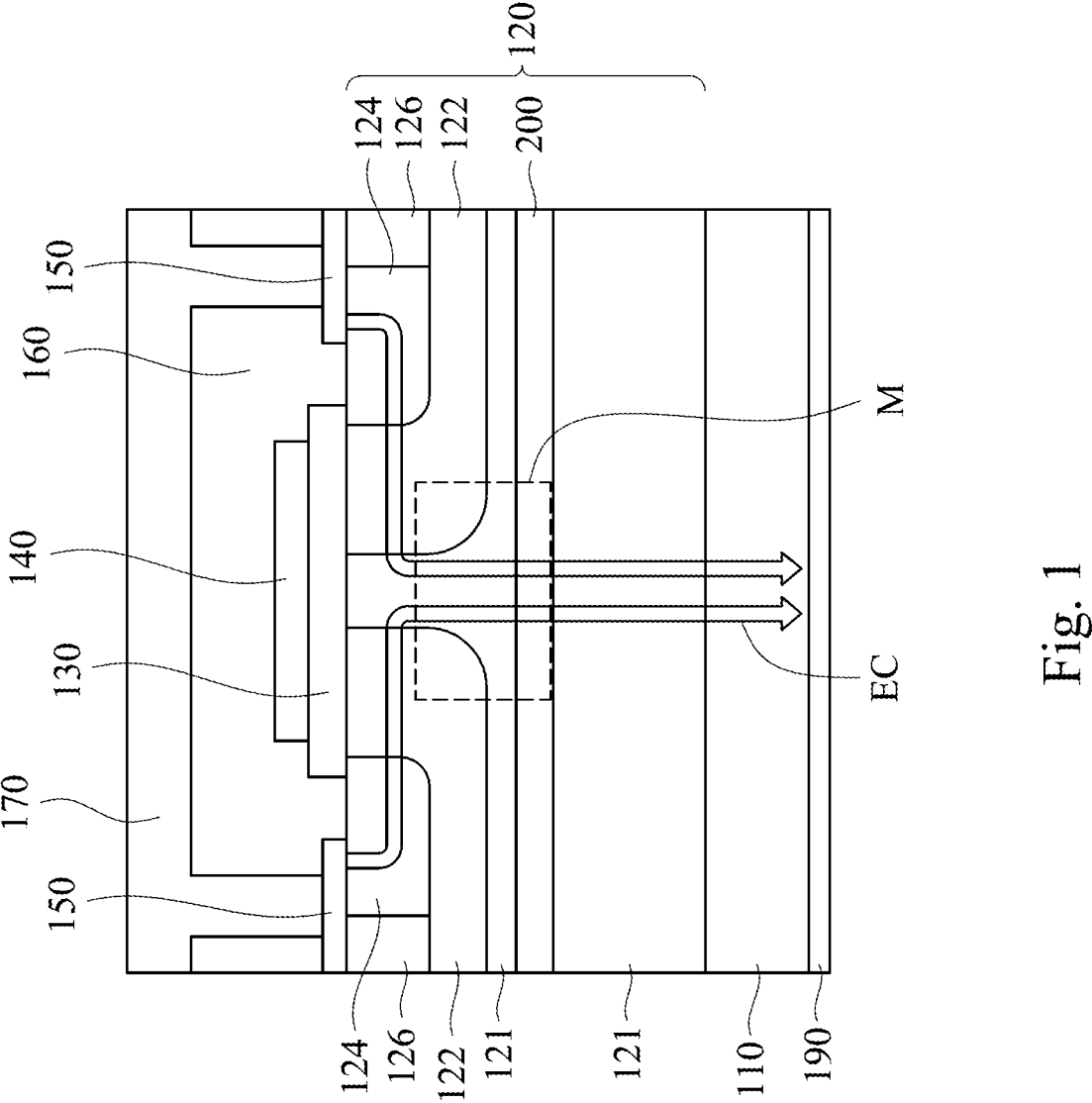
FIG. 1 illustrates a cross-section view of a semiconductor device in some embodiments of the disclosure.

FIG. 1 illustrates a cross-section view of a semiconductor device 100 in some embodiments of the disclosure. The semiconductor device 100 includes a substrate 110, and epitaxial layer 120, well regions 122, a current spreading layer 200, source regions 124, base regions 126, and a gate layer 140. The epitaxial layer 120 is on the substrate 110. The well regions 122 are in the epitaxial layer 120. The current spreading layer 200 is in the epitaxial layer 120 and below the well regions 122. Compared to the substrate 110, the current spreading layer 200 is closer to the well regions 122. The source regions 124 are in the well regions 122. The base regions 126 are in the well regions 122 and adjacent to the source regions 124. The gate layer 140 is over the epitaxial layer 120 and the current spreading layer 200. The well region 122 includes a channel region 122C, and the channel region 122C is adjacent to the source region 124.

The semiconductor device 100 may include regions having different semiconductor-types. In some embodiments, the epitaxial layer 120 may include a drift region 121, the well regions 122, the source regions 124 and the base regions 126. The substrate 110, the drift region 121 and the source region 124 may include a plurality of dopants of the first semiconductor-type (such as N-type). The well regions 122 and base regions 126 may include a plurality of dopants of the second semiconductor-type (such as P-type). The second semiconductor-type is different from the first semiconductor-type. In some embodiments, the substrate 110 and the source regions 124 may be first semiconductor-type heavily doped region. The drift region 121 may be first semiconductor-type lightly doped region. The well regions 122 may be second semiconductor-type lightly doped region. The base regions 126 may be second semiconductor-type heavily doped region.

The semiconductor device 100 further includes a gate dielectric layer 130. The gate dielectric layer 130 is under the gate layer 140 and on the epitaxial layer 120. That is, the gate dielectric layer 130 is between the gate layer 140 and the epitaxial layer 120. The semiconductor device 100 further includes source contacts 150, a dielectric layer 160, an interconnection structure 170 and a drain electrode 190. The source contacts 150 are on the source regions 124 and the base regions 126. The dielectric layer 160 covers the epitaxial layer 120, the gate dielectric layer 130, the gate layer, 140 and the source contacts 150. The interconnection structure 170 penetrates the dielectric layer 160 and is in contact with the source contacts 150. The drain electrode 190 is under the substrate 110.

The current spreading layer 200 may be used to expand the range of the electron flow. Specifically, after providing a voltage to the gate layer 140 (i.e. the transistor is on), electron flow EC flows from the source contact 150, through the source region 124, the channel region 122C, the drift region 121, the current spreading layer 200, the substrate 110 to the drain electrode 190. Since the electron passes the channel region 122C in a horizontal direction, the path of the electron flow EC tends to be restricted. When the electron flow EC passes through the current spreading layer 200, the current spreading layer 200 is able to disperse the path of the electron flow, so that the electron flow is not concentrated in the same region. For example, the electron flow is not concentrated in the drift region 121 under the gate layer 140. Therefore, the electron flow of the semiconductor device 100 is increased, and the power conversion efficiency of the semiconductor device 100 is enhanced.

Figure 2A:
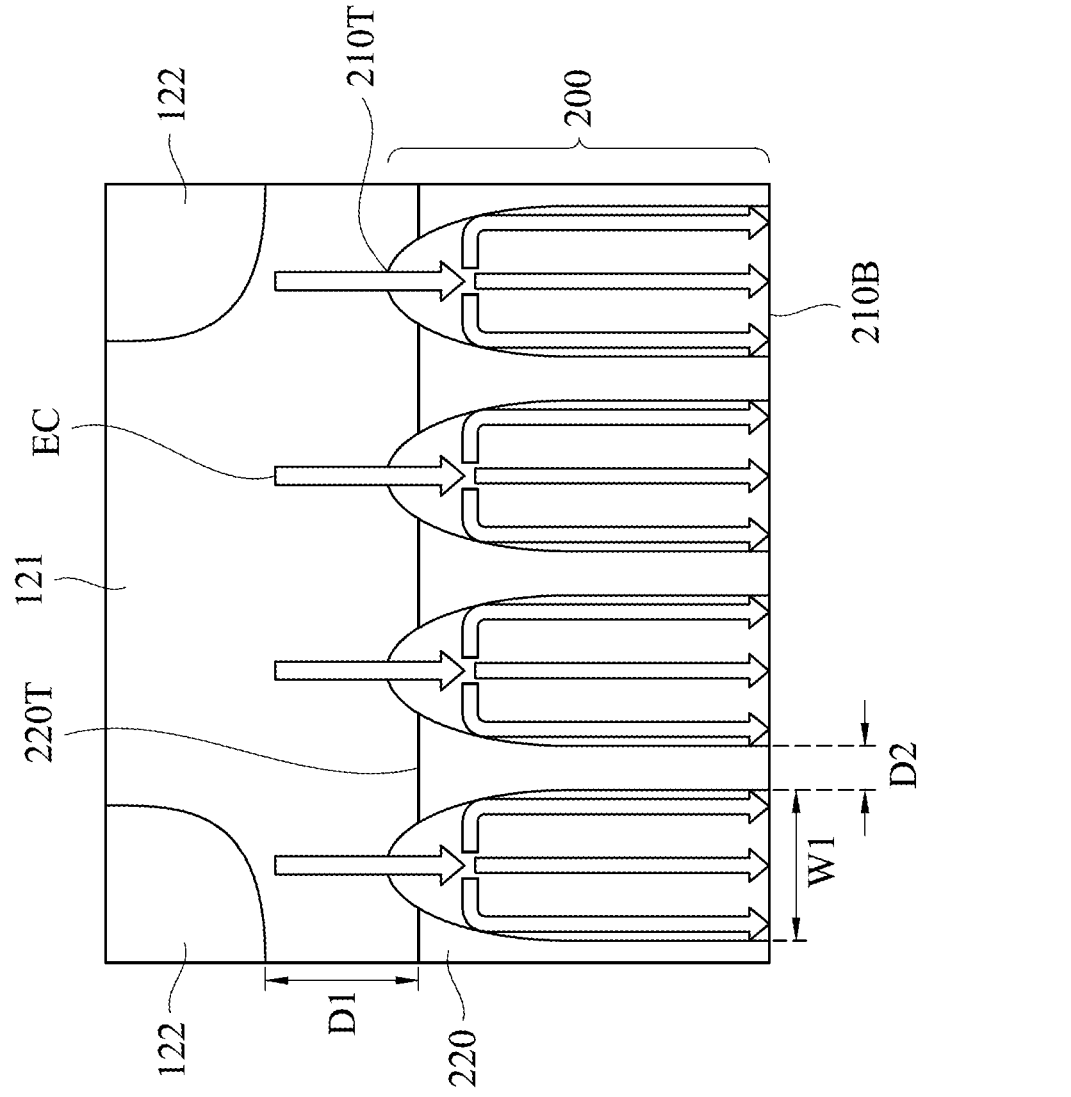
FIG. 2A illustrates and enlargement view of region M in FIG. 1, and region M illustrates the relative position of the current spreading layer, the well regions and the drift region.

FIG. 2A illustrates and enlargement view of region M in FIG. 1, and region M illustrates the relative position of the current spreading layer 200, the well regions 122 and the drift region 121. The current spreading layer 200 includes a plurality of the first doped regions 210 and a plurality of the second doped regions 220. The first doped regions 210 include a plurality of dopants of the first semiconductor-type. The second doped regions 220 include a plurality of dopants of the second semiconductor-type, and the second semiconductor-type is different from the first semiconductor-type. The first doped regions 210 and the second doped regions 220 are alternately arranged. That is, the first doped regions 210 include the dopants, and the semiconductor-type of the dopants is same as that of the dopants in the substrate 110, the drift region 121 and the source regions 124. The second doped regions 220 include the dopants, and the semiconductor-type of the dopants is same as that of the dopants in the well regions 122 and the base regions 126. In some, embodiments, the first doped regions 210 are first semiconductor-type heavily doped region, and the second doped regions 220 are second semiconductor-type heavily doped region.

The first doped regions 210 have top portions 210T and bottom portions 210B, and the top portions 210T are narrower than the bottom portions 210B of the first doped regions 210. The top portions 210T of the first doped regions 210 upwardly protrude from top portions 220T of the second doped regions 220. A distance D1 is between the second doped regions 220 and the well regions 122. That is, a portion of the drift region 121 is between the second doped regions 220 of the current spreading layer 200 and the well regions 122. The first doped regions 210 have widths W1, and a distance D2 is between adjacent first doped regions 210. In some embodiments, the distance D1 is in a range from 0.8 to 1.5 micrometers, the width W1 at the bottom portion 210B is in a range from 1 to 2 micrometers, and the distance D2 is in a range from 100 to 500 nanometers. When electron flow EC passes through the drift region 121 and enters the current spreading layer 200, the electron flow EC enters from the top portions 210T of the current spreading layer 200 and flows downwardly. Since the width W1 of the first doped region 210 decreases as getting close to the well regions 122, the flowing region of the electron flow EC becomes wider. The advantage of gradually expanding the flowing region of the electron flow EC is achieved. The second doped regions 220 are disposed between the adjacent first doped regions 210, and the top portions 220T of the second doped regions 220 are lower than the top portions 210T of the first doped regions 210. Therefore, the electron flow EC is introduced to the first doped regions 210. The second doped regions 220 are used to maintain the breakdown voltage of the semiconductor device 100 (FIG. 1), so that the semiconductor device 100 is able to withstand the driving voltage at a certain level.

Figure 2B:
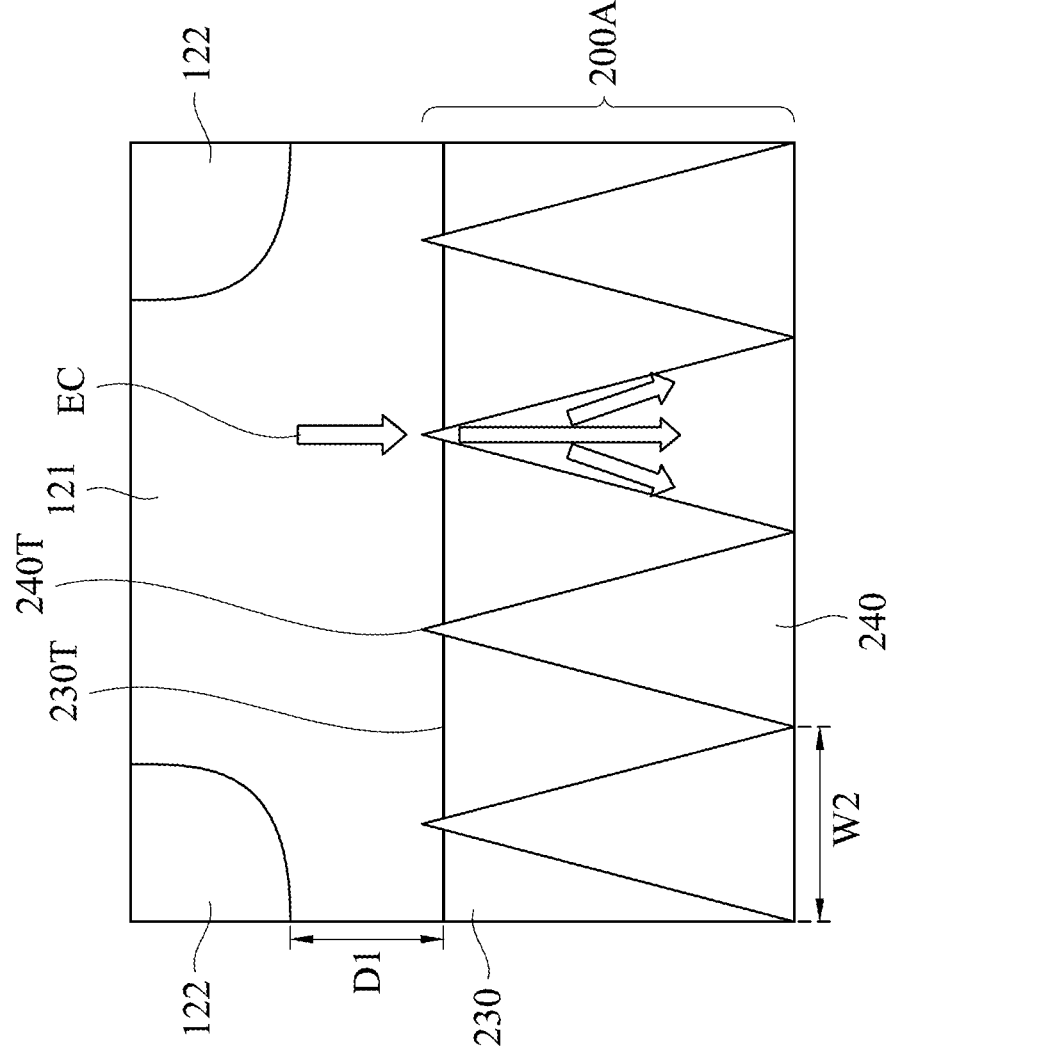
FIGS. 2B-2F illustrate cross-section views of the current spreading layer, the well regions and the drift region.

FIGS. 2B-2F illustrate the current spreading layers in different embodiments. FIG. 2B illustrates a cross-section view of the current spreading layer 200A, the well regions 122 and the drift region 121 in some other embodiments in the present disclosure. The current spreading layer 200A includes a doped region 230 having a plurality of dopants of the second semiconductor-type and a plurality of conductive materials 240. The conductive materials 240 are arranged in the doped region 230. In some embodiments, the conductive materials 240 may be metal, such as titanium, nickel or silver. The top portions 240T of the conductive materials 240 upwardly protrudes from the top portion 230T of the doped region 230. Therefore, the top portions 240T of the conductive materials 240 are in contact with the drift region 121. The conductive materials 240 may be structures having narrow top portions and wide bottom portions. For example, the conductive materials 240 may be triangles. The bottom portions of the conductive materials 240 have widths W2. In some embodiments, the width W2 is in a range from 5 to 10 micrometers. In some embodiment, the bottom portions of the adjacent conductive materials 240 are in contact with each other. When electron flow EC passes through the drift region 121 and enters the current spreading layer 200A, the electron flow EC enters from the top portions 240T of the conductive materials 240 and flows downwardly. Since the conductive materials 240 are the structures having narrow top portions and wide bottom portions, the flowing region of the electron flow EC becomes wider. The advantage of gradually expanding the flowing region of the electron flow EC is achieved. Since the bottom portions of the conductive materials 240 are connected together, the flowing region of the electron flow EC is further expanded. As such, the power conversion efficiency of the semiconductor device 100 (FIG. 1) is further enhanced.

Figure 2C:
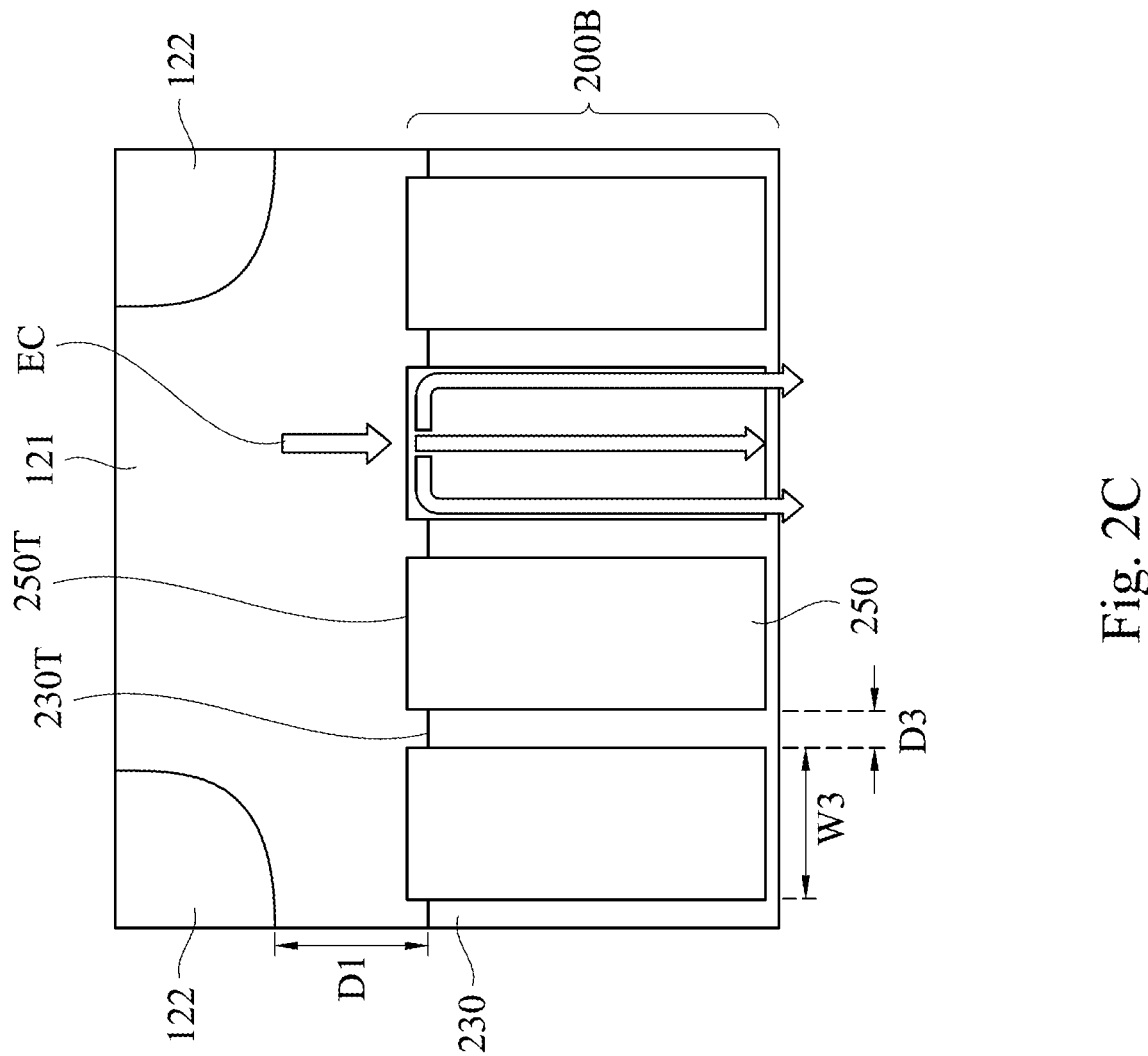

FIG. 2C illustrates a cross-section view of the current spreading layer 200B, the well regions 122 and the drift region 121 in some other embodiments in the present disclosure. The current spreading layer 200B includes a doped region 230 having a plurality of dopants of the second semiconductor-type and a plurality of conductive materials 250. The conductive materials 250 are arranged in the doped region 230. The doped region 230 and the drift region 121 have different semiconductor-types. In some embodiments, the conductive materials 250 may be metal, such as titanium, nickel or silver. The top portions 250T of the conductive materials 250 upwardly protrude from the top portion 230T of the doped region 230. Therefore, the top portions 250T of the conductive materials 250 are in contact with the drift region 121. The Widths W3 of the conductive materials 250 are the same from bottom to top. For example, the conductive materials 250 may be rectangles. In some embodiments, the width W3 is in a range from 5 to 10 micrometers. A distance D3 is between the adjacent conductive materials 250. In some embodiments, the distance D3 is in a range from 1 to 3 micrometers. When electron flow EC passes through the drift region 121 and enters the current spreading layer 200B, the electron flow EC enters from the top portions 250T of the conductive materials 250 and flows downwardly. The flowing region of the electron flow EC becomes wider to achieve the advantage of gradually expanding the flowing region of the electron flow EC.

Figure 2D:
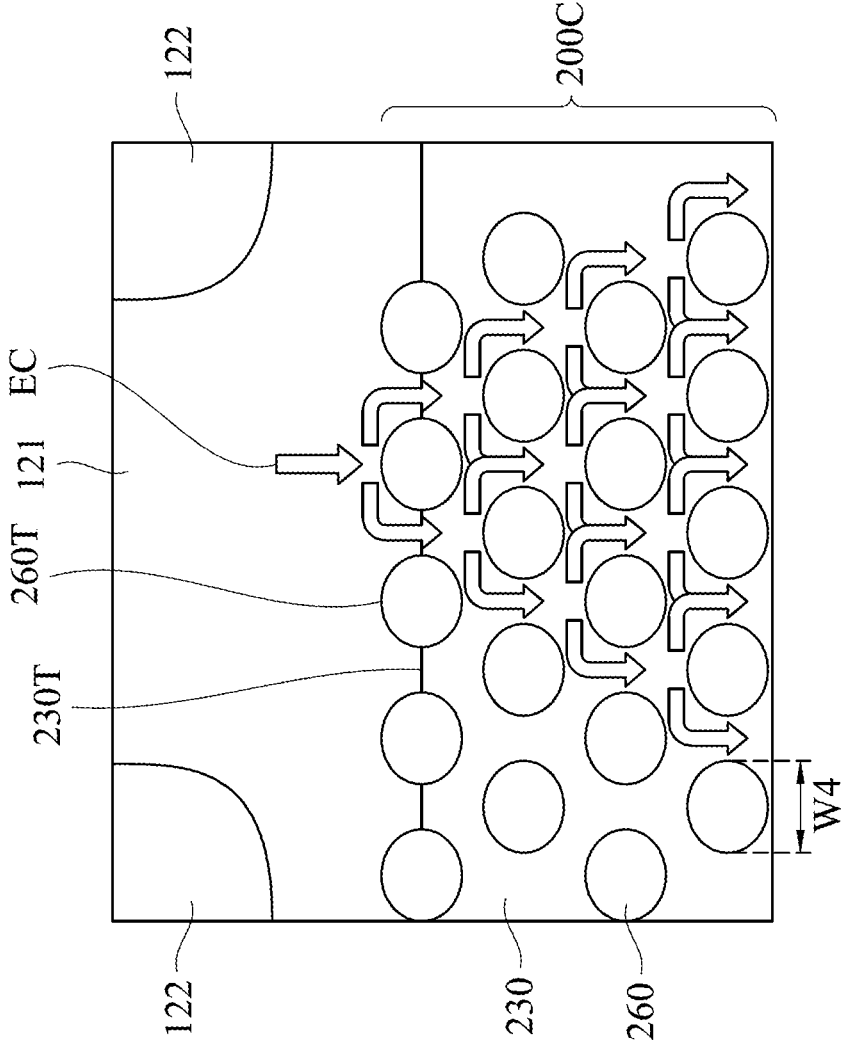

FIG. 2D illustrates a cross-section view of the current spreading layer 200C, the well regions 122 and the drift region 121 in some other embodiments in the present disclosure. The current spreading layer 200C includes a doped region 230 having a plurality of dopants of the second semiconductor-type and a plurality of conductive materials 260. The conductive materials 260 are arranged in the doped region 230. The doped region 230 and the drift region 121 have different semiconductor-types. The conductive materials 260 may be metal particles, such as nanometer-sized gold particles. In some embodiments, the diameters W4 of the conductive materials 260 may be in a range of several nanometers to 100 nanometers. The conductive materials 260 are arranged in rows. At least one of the top portions 260T of the conductive materials 260 upwardly protrudes from the top portion 230T of the doped region 230. Therefore, the top portions 260T of the conductive materials 260 are in contact with the drift region 121. For example, the top portions 260T of the conductive materials 260 at the upmost row are in contact with the drift region 121. When electron flow EC passes through the drift region 121 and enters the current spreading layer 200C, the electron flow EC flows along the surfaces of the conductive materials 260 at the upmost row to the surfaces of the conductive materials 260 at the next row, finally to the surfaces of the conductive materials 260 at the bottommost row. Therefore, the advantage of gradually expanding the flowing region of the electron flow EC is achieved. The conductive materials 260, the conductive materials 240 in FIG. 2B, and the conductive materials 250 in FIG. 2C are all metal materials. The difference between the conductive materials 260 and the other two is that the sizes of the conductive materials 240 and the conductive materials 250 are larger. Therefore, the electron flow EC may flow to the interior of the conductive materials 240 and the conductive materials 250. The sizes of the conductive materials 260 are smaller. Therefore, the electron flow EC may flow along to the surfaces of the conductive materials 260, and does not flow to the interior of the conductive materials 260.

Figure 2E:
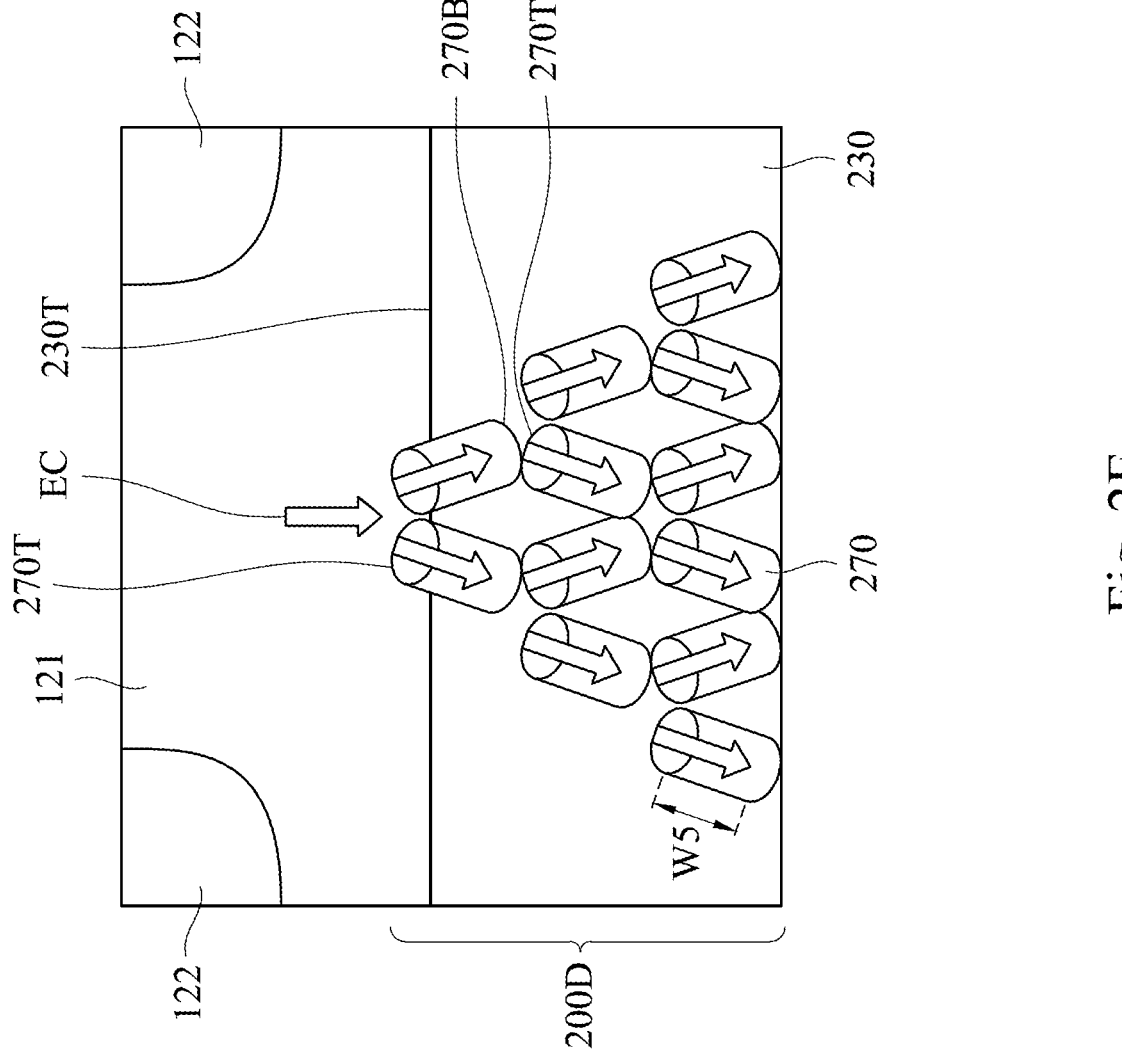

FIG. 2E illustrates a cross-section view of the current spreading layer 200D, the well regions 122 and the drift region 121 in some other embodiments in the present disclosure. The current spreading layer 200D includes a doped region 230 having a plurality of dopants of the second semiconductor-type and a plurality of conductive materials 270. The conductive materials 270 are arranged in the doped region 230. The doped region 230 and the drift region 121 have different semiconductor-types. The conductive materials 270 may be carbon nanotubes, and the conductive materials 270 may be inclined and arranged in rows. The conductive materials 270 may be in contact with each other. For example, the bottom portions 270B of the conductive materials 270 at the upper row may in contact with the top portions 270T of the conductive materials 270 at the lower row. At least one of the top portions 270T of the conductive materials 270 upwardly protrudes from the top portion 230T of the doped region 230. For example, the top portions 270T of the conductive materials 270 at the upmost row are in contact with the drift region 121. The conductive materials 270 have widths W5. In some embodiments, the width W5 is in a range of 5 to 10 nanometers. When electron flow EC passes through the drift region 121 and enters the current spreading layer 200D, the electron flow EC flows along the interiors of the conductive materials 270 at the upmost row to the interiors of the conductive materials 270 at the next row, finally to the interiors of the conductive materials 270 at the bottommost row. Therefore, the advantage of gradually expanding the flowing region of the electron flow EC is achieved.

Figure 2F:
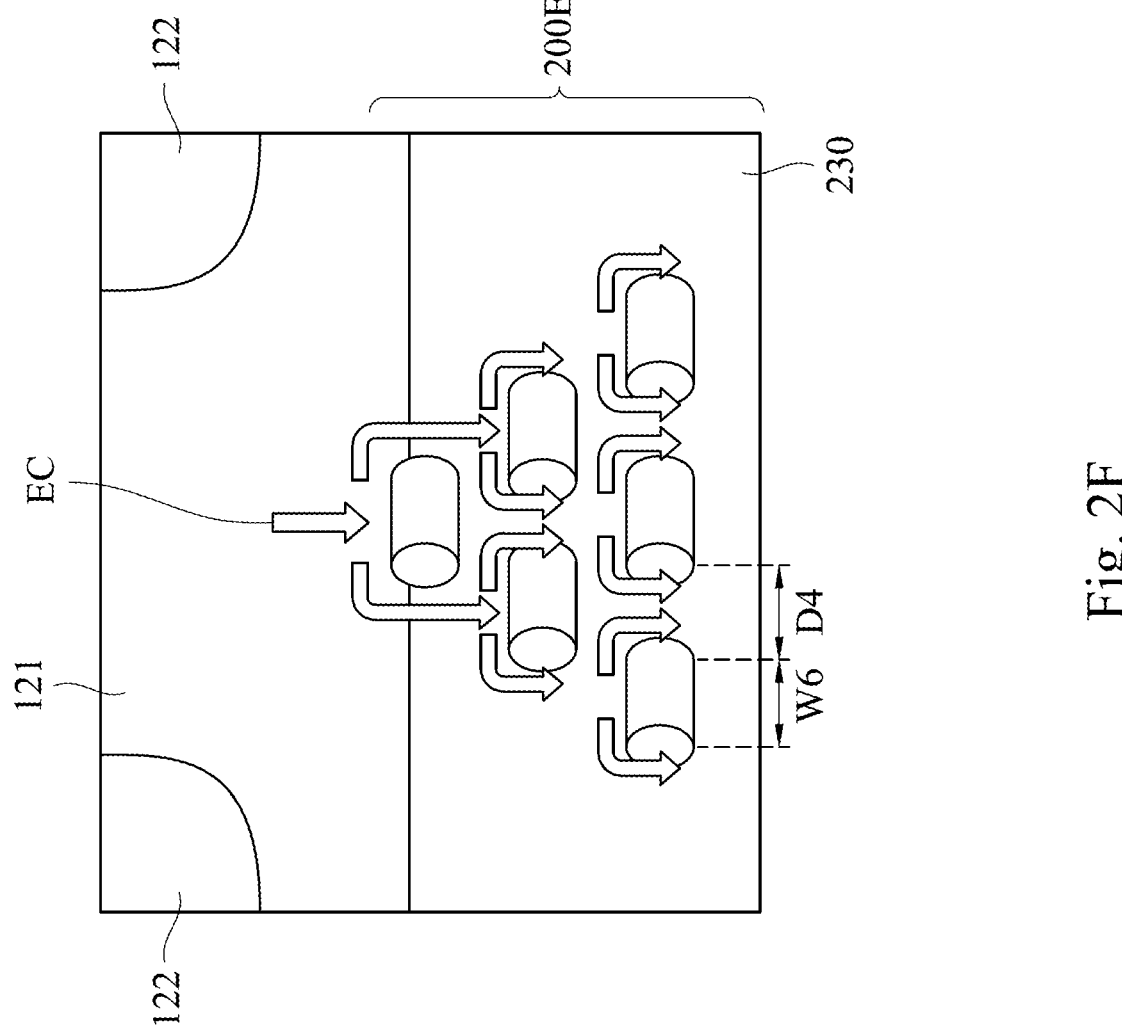

FIG. 2F illustrates a cross-section view of the current spreading layer 200E, the well regions 122 and the drift region 121 in some other embodiments in the present disclosure. The current spreading layer 200E includes a doped region 230 having a plurality of dopants of the second semiconductor-type and a plurality of conductive materials 280. The conductive materials 280 are arranged in the doped region 230. The doped region 230 and the drift region 121 have different semiconductor-types. The conductive materials 280 may be carbon nanotubes, and the conductive materials 280 may be horizontal and arranged in rows. The conductive materials 280 may not be in contact with each other, and a distance D4 is between the adjacent conductive materials 280. In some embodiments, the distance D4 is in a range from 0.3 to 1.0 nanometer. The top portions 280T of the conductive materials 280 at the upmost row are in contact with the drift region 121. When electron flow EC passes through the drift region 121 and enters the current spreading layer 200E, the electron flow EC flows along the surfaces of the conductive materials 280 at the upmost row to the surfaces of the conductive materials 280 at the next row, finally to the surfaces of the conductive materials 280 at the bottommost row. Therefore, the advantage of gradually expanding the flowing region of the electron flow EC is achieved. The conductive materials 280 and the conductive materials 270 in FIG. 2E are all carbon nanotubes. The difference between the conductive materials 280 and the conductive materials 270 is that the more conductive parts of the conductive materials are different. For example, the surfaces of the conductive materials 280 are more conductive. Therefore, the electron flow EC tends to flow along the surfaces of the conductive materials 280. The interiors of the conductive materials 280 are more conductive. Therefore, the electron flow EC tends to flow along to the interiors of the conductive materials 270.

Figure 3:
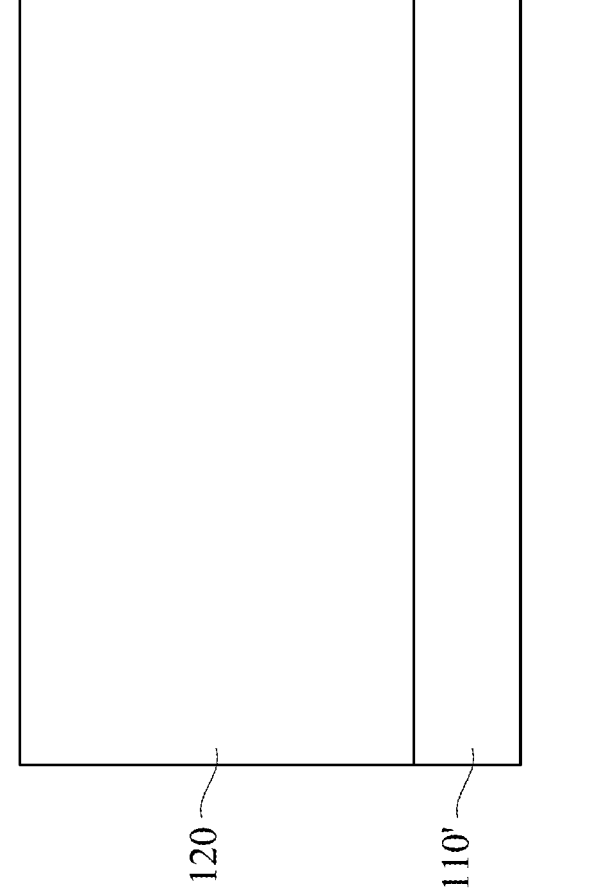
FIGS. 3-16 illustrate cross-section views of a manufacturing method of the semiconductor device in some embodiments of the present disclosure

FIGS. 3-16 illustrate cross-section views of a manufacturing method of the semiconductor device 100 in some embodiments of the present disclosure. Referring to FIG. 3, a substrate 110' and an epitaxial layer 120 are provided. The substrate 110' may be any suitable substrate. In some embodiments, the substrate 110' may be made of (but not limited to) silicon carbide. The substrate 110' may be doped with dopants of the first semiconductor-type. For example, the substrate 110' may be N-type heavily doped substrate, such as the heavily doped region including N-type dopants such as phosphorous, arsenic, etc. Subsequently, the epitaxial layer 120 is formed on the substrate 110'. In some embodiments, the epitaxial layer 120 may be made of (but not limited to) silicon carbide. The epitaxial layer 120 may be doped with dopants of the first semiconductor-type. For example, the epitaxial layer 120 may be N-type lightly doped substrate, such as the lightly doped region including N-type dopants such as phosphorous, arsenic, etc. That is, the doping concentration of the epitaxial layer 120 may be lower than that of the substrate 110'.

Figure 4:
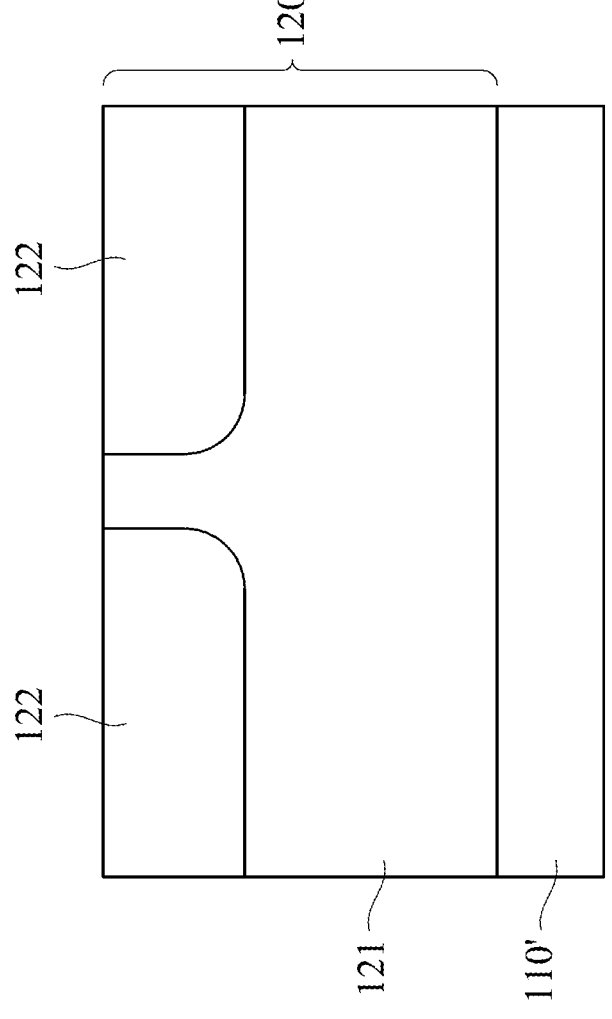

Referring to FIG. 4, the well regions 122 are formed in the epitaxial layer 120. Specifically, a patterned mask layer may be formed on the epitaxial layer 120. Subsequently, an ion implantation is performed to implant the dopants of the second semiconductor-type from above of the epitaxial layer 120 to form the well regions 122 having the dopants of the second semiconductor-type. After the ion implantation process, the patterned mask layer may be removed. After forming the well regions 122, the epitaxial layer 120 is divided into the well regions 122 doped with the dopants of the second semiconductor-type and the drift region 121 not doped with the dopants of the second semiconductor-type, and the well regions 122 are cladded by the epitaxial layer 120. Therefore, the drift region 121 still includes the dopants of the first semiconductor-type. For example, the drift region 121 still remains as a N-type lightly doped region. In some embodiments, the well regions 122 may be P-type lightly doped substrate, such as the lightly doped region including P-type dopants such as boron, gallium, etc.

Figure 5:
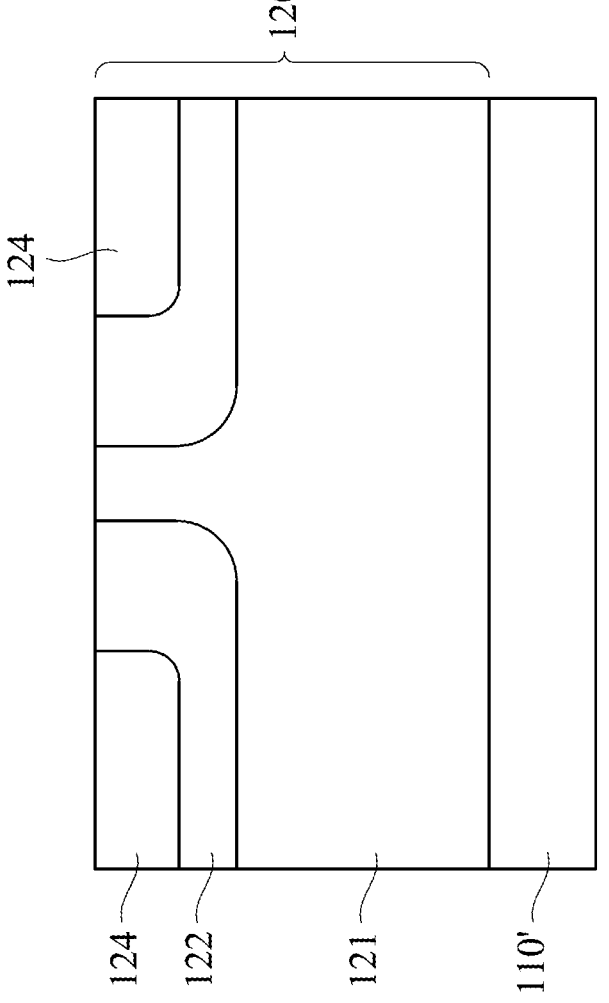

Referring to FIG. 5, the source regions 124 are formed in the well regions 122. Specifically, another patterned mask layer may be formed on the epitaxial layer 120. Subsequently, an ion implantation is performed to implant the dopants of the first semiconductor-type from above of the well regions 122 to form the source regions 124 having the dopants of the first semiconductor-type. After the ion implantation process, the patterned mask layer may be removed. The side and the bottom of the source regions 124 are cladded by the well regions 122. In some embodiments, the source regions 124 may be N-type heavily doped substrate, such as the heavily doped region including N-type dopants such as phosphorous, arsenic, etc. That is, the doping concentration of the source regions 124 may be higher than that of the drift region 121.

Figure 6:
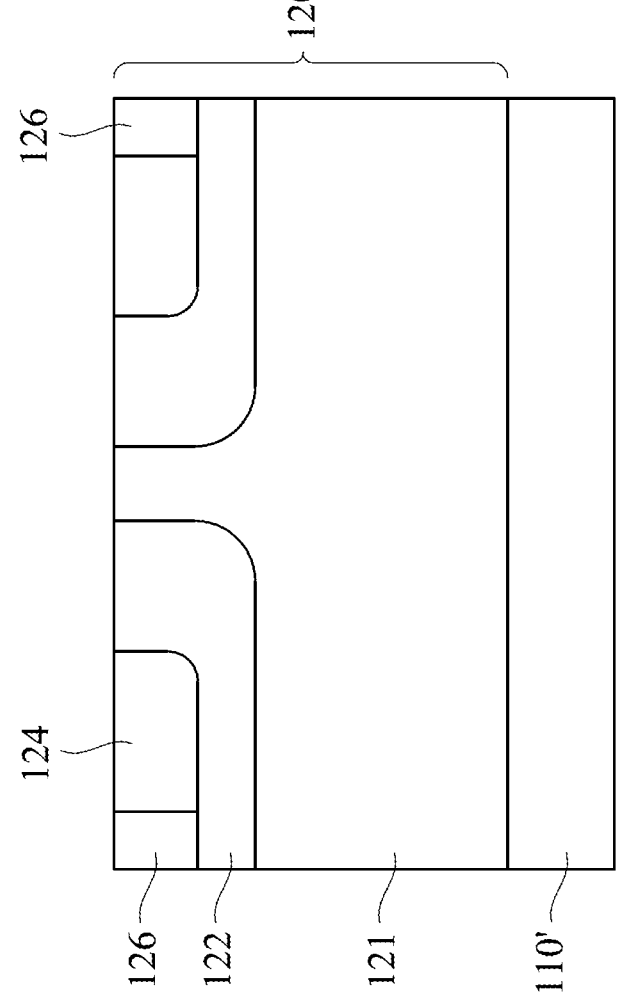

Referring to FIG. 6, the base regions 126 are formed in the source regions 124. Specifically, an ion implantation is performed to implant the dopants of the second semiconductor-type in the source regions 124 to form the base regions 126 having the dopants of the second semiconductor-type. The bottom of the base regions 126 may be in contact with the well regions 122, and the base regions 126 does not extend towards the well regions. In some embodiments, the base regions 126 may be P-type heavily doped substrate, such as the heavily doped region including P-type dopants such as boron, gallium, etc. That is, the doping concentration of the base regions 126 may be higher than that of the well regions 122.

Figure 7:
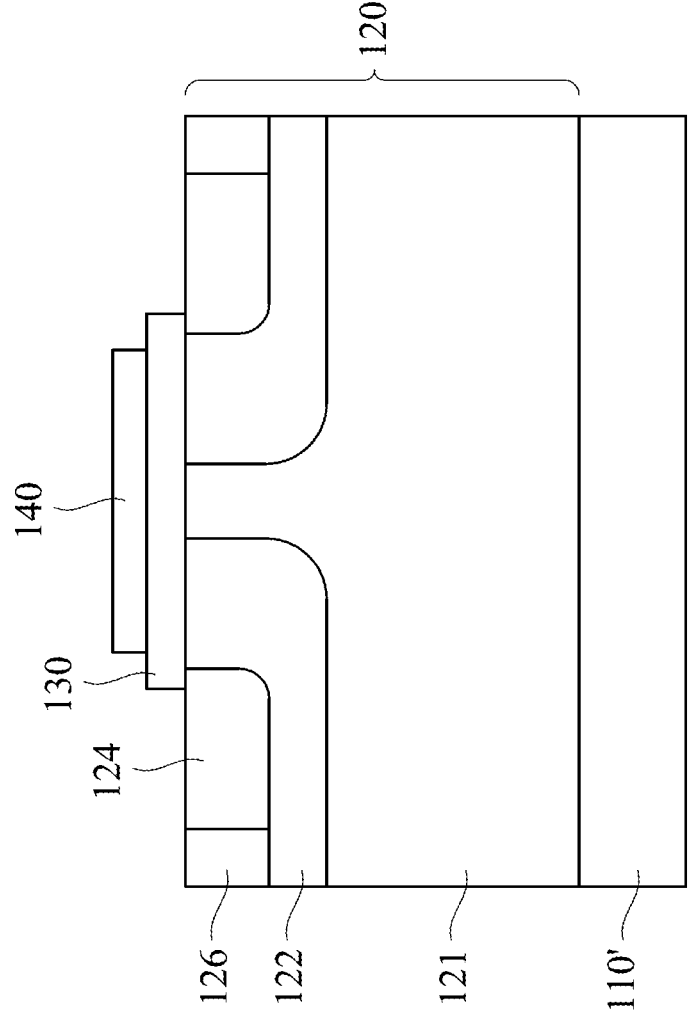

It is noted that the sequence of the processes in FIGS. 4-6 may be adjusted. Therefore, the sequence of forming the well regions 122, the source regions 124 and the base regions 126 may also be adjusted. For example, the base regions 126 may be first formed in the epitaxial layer 120. Subsequently, the source regions 124 are formed. Subsequently, the well regions 122 are formed Referring to FIG. 7, the gate dielectric layer 130 and the gate layer 140 are formed on the epitaxial layer 120. Specifically, in some embodiments, a dielectric layer is first formed on the epitaxial layer 120. Subsequently, the dielectric layer is patterned to form the gate dielectric layer 130. The gate dielectric layer 130 covers a portion of the well regions 122, and the gate dielectric layer 130 covers the drift region 121 between two adjacent well regions 122. Subsequently, a semiconductor layer is formed on the epitaxial layer 120 and the gate dielectric layer 130. Subsequently, the semiconductor layer to form the gate layer 140. In some embodiments, the width of the gate layer 140 is smaller than that of the gate dielectric layer 130. Therefore, the gate layer 140 exposes a portion of the gate dielectric layer 130, as shown in FIG. 7.

In some other embodiments, a dielectric layer and the semiconductor layer may also be sequentially formed on the epitaxial layer 120. Subsequently, the semiconductor layer is first patterned to form the gate layer 140, and then the dielectric layer is patterned by using the gate layer 140 as the mask to form the gate dielectric layer 130. Therefore, the sidewall of the gate layer 140 is aligned with the sidewall of the gate dielectric layer 130 (not illustrated). In some embodiments, the gate dielectric layer 130 is made of (but not limited to) SiO, SiN, SiON, combinations thereof or the like. In some embodiments, the gate layer 140 may be made of (but not limited to) polysilicon.

Figure 8:
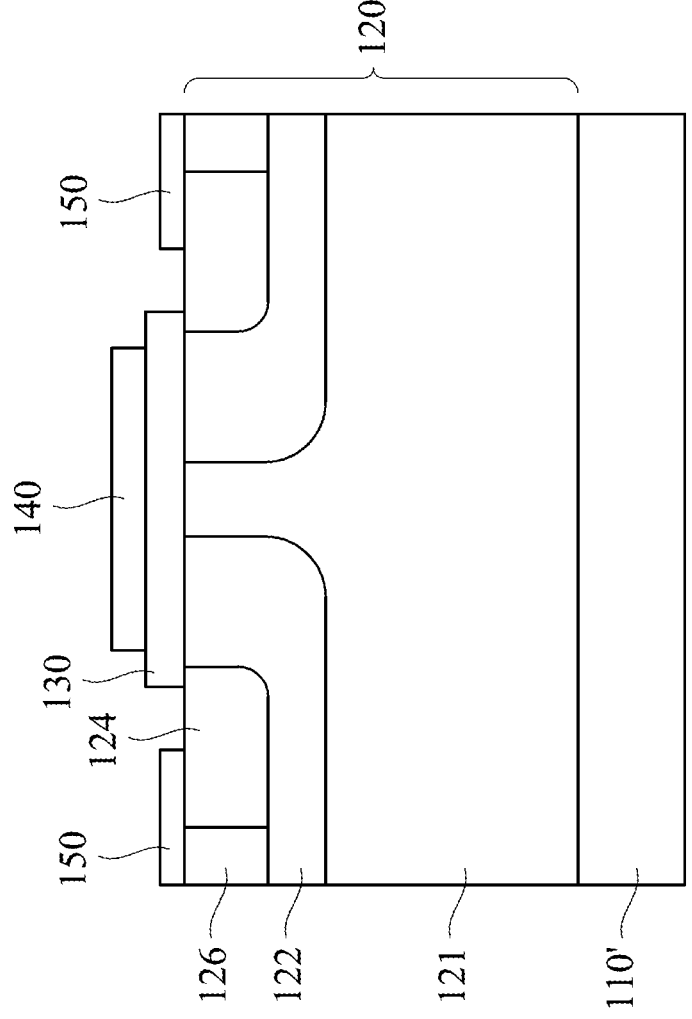

Referring to FIG. 8, the source contacts 150 are formed on the source regions 124 and the base regions 126. Specifically, a conductive layer is first formed on the structure in FIG. 7, and then the conductive layer is patterned to form the source contacts 150 on the source regions 124 and the base regions 126. In some embodiments, the source contacts 150 may be made of (but not limited to) aluminum, titanium, titanium oxide, the like, or combinations thereof.

Figure 9:
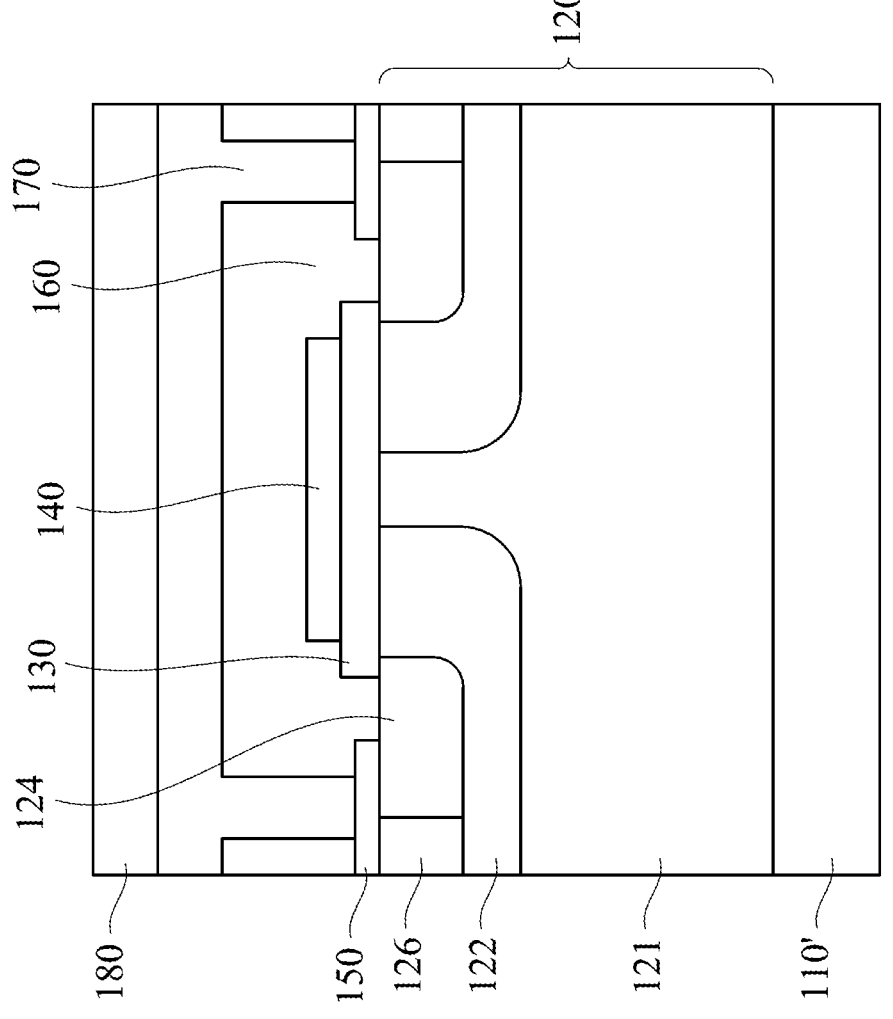

Referring to FIG. 9, the dielectric layer 160 may be formed on the gate dielectric layer 130 and the gate layer 140. Subsequently, the interconnection structure 170 is formed in the dielectric layer 160. Specifically, the dielectric layer 160 may be first formed on the gate dielectric layer 130 and the gate layer 140, such that the dielectric layer 160 covers the gate dielectric layer 130, the gate layer 140 and the source contacts 150. Subsequently, openings are formed in the dielectric layer 160, and the interconnection structure 170 is formed in the openings. The interconnection structure 170 is in contact with the source contacts 150. In some embodiments, the dielectric layer 160 are made of (but not limited to) SiO, SiN, the like or combinations thereof. The interconnection structure 170 may be made of (but not limited to) aluminum, titanium, titanium oxide, the like, or combinations thereof. Subsequently, a carrier 180 is formed on the dielectric layer 160 and the interconnection structure 10. The carrier 180 is used to provide support in subsequent process of grinding the semiconductor device 100.

Figure 10:
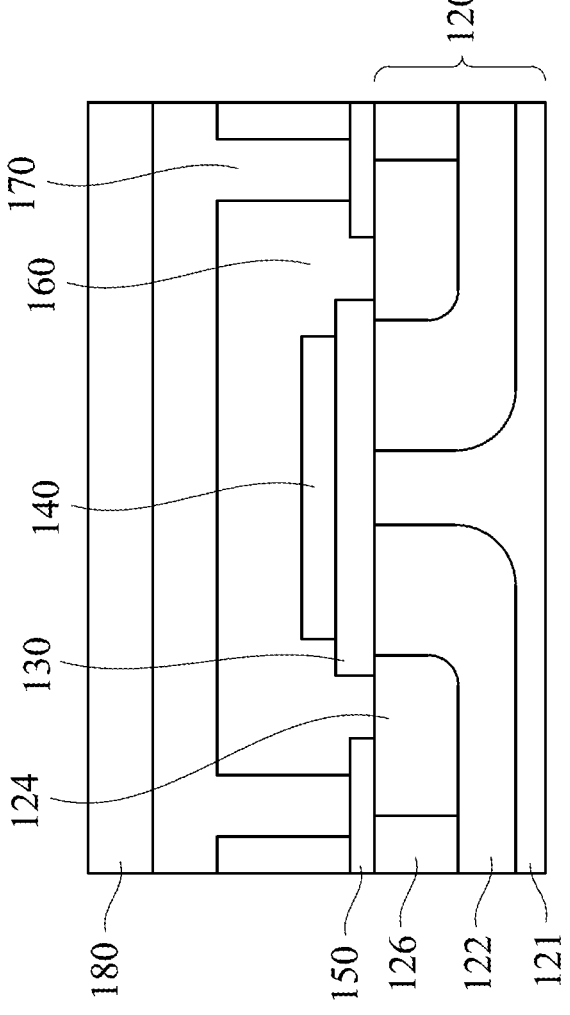

Referring to FIG. 10, the semiconductor device 100 is grinded from the bottom of the semiconductor device 100 to remove the substrate 110' and a portion of the epitaxial layer 120. After removing the substrate 110' and the portion of the epitaxial layer 120, distance is between the bottom of the epitaxial layer 120 and the well regions 122. That is, the portion of the epitaxial layer 120 removed in FIG. 10 is the drift region 121, and the well regions 122, the source regions 124 and the base regions 126 are not removed. In some embodiments, before grinding the semiconductor device 100, the semiconductor device 100 is flipped upside down. It is noted that FIG. 10 and the following figures illustrate the semiconductor device 100 not flipping in order to make the terms of the orientations of the semiconductor device consistent (such as bottom, top). However, it does not mean that the present disclosure only discloses the embodiments in which the semiconductor device 100 is not flipped and the subsequent processes are directly performed.

Figure 11:
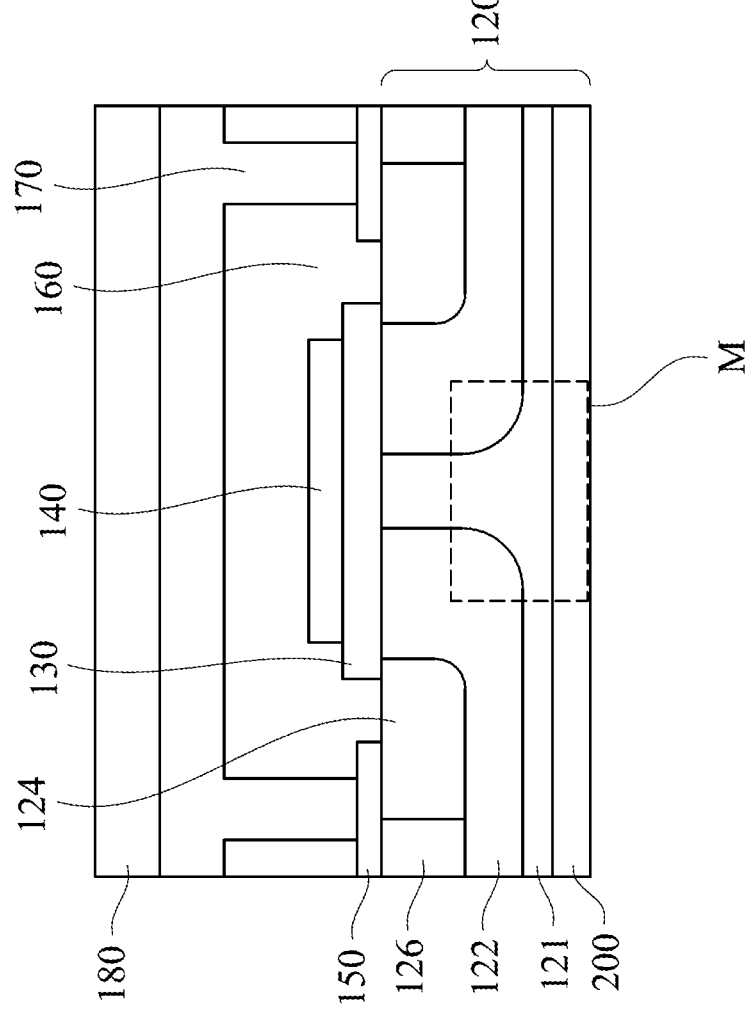
Figure 12A:
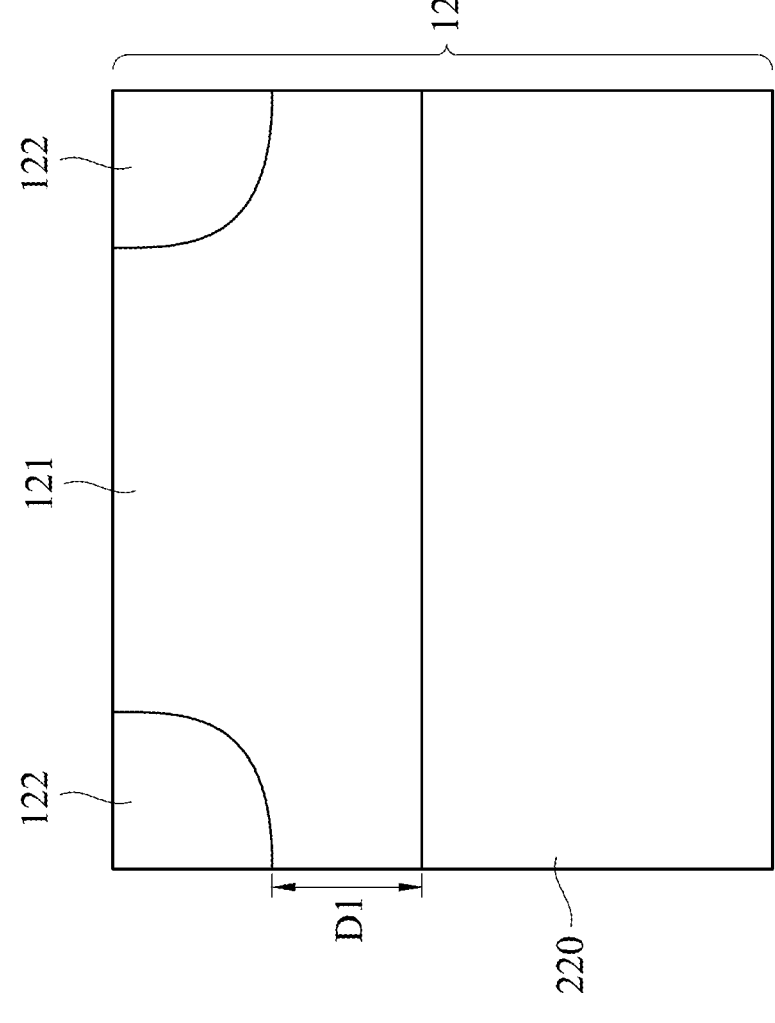
Figure 12B:
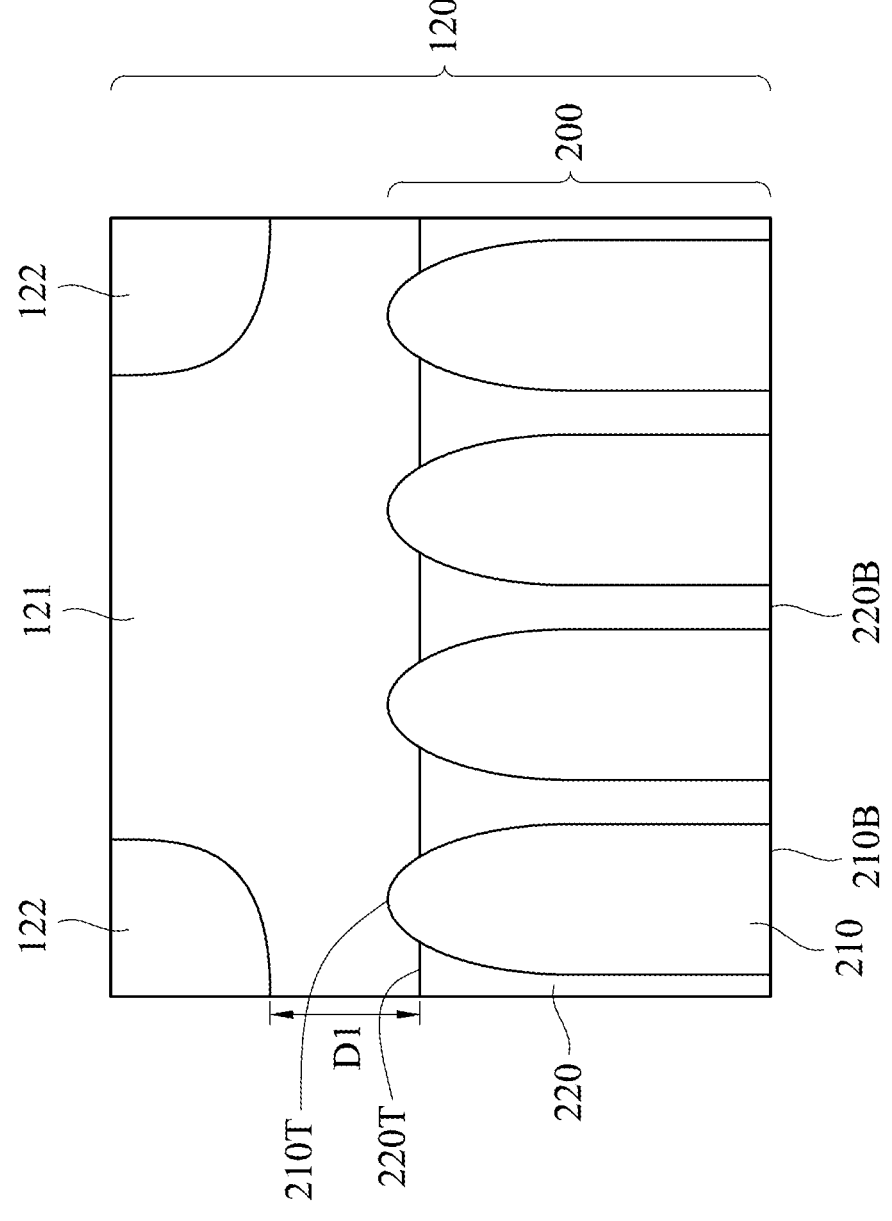

Referring to FIG. 11, the current spreading layer 200 is formed at the bottom of the epitaxial layer 120. FIGS. 12A-12B illustrate a formation of the current spreading layer 200 in some embodiments, and FIGS. 12A-12B take region M in FIG. 11 as an example. Referring to FIG. 12A, an ion implantation is first performed to implant the dopants of the second semiconductor-type from the bottom of the epitaxial layer 120 to form the second doped regions 220 having the dopants of the second semiconductor-type. In some embodiments, a P-type ion implantation is performed to implant P-type dopants from the bottom of the epitaxial layer 120 to form the P-type doped regions 220 at the bottom of the epitaxial layer 120. The P-type doped regions 220 may be heavily doped regions, such as the heavily doped regions including P-type dopants such as boron, gallium, etc. After forming the second doped regions 220, the distance D1 is between the second doped regions 220 and the well regions 122. In some embodiments, the distance D1 is in a range from 0.8 to 1.5 micrometers. Subsequently, referring to FIG. 12B, the first doped regions 210 arranged in the second doped regions 220 are formed. Specifically, a patterned mask layer may be formed under the epitaxial layer 120. An ion implantation is performed to implant the dopants of the first semiconductor-type from bottom of the epitaxial layer 120 to form the first doped regions 210 having the dopants of the first semiconductor-type, and the first doped regions 210 are arranged in the second doped regions 220. In some embodiments, an N-type ion implantation is performed to implant N-type dopants from the bottom of the epitaxial layer 120 to form the N-type doped regions 210. The N-type doped regions 210 may be heavily doped regions, such as the heavily doped regions including N-type dopants such as phosphorous, arsenic, etc. Since the ions are implanted from the bottom of the epitaxial layer 120, the widths of the first doped regions 210 close to the well regions 122 are smaller than the widths of the first doped regions 210 far away from the well regions 122. The doping intensity of the first doped regions 210 may be controlled, such that the top portions 210T of the first doped regions 210 protrude from top portions 220T of the second doped regions 220. The bottom portions 210B of the first doped regions 210 are leveled with the bottom portions 220B of the second doped regions 220. That is, the first doped regions 210 may be in contact with the drift region 121. In some embodiments, the top portions 210T of the first doped regions 210 may be also leveled with the top portions 220T of the second doped regions 220.

Figure 13A:
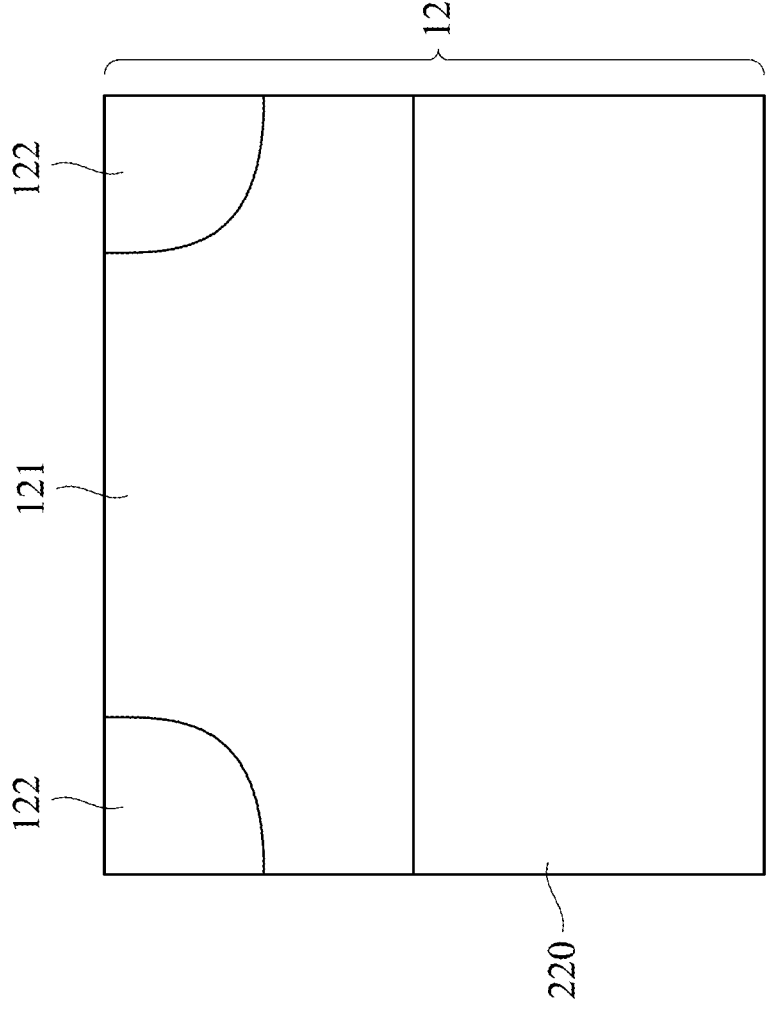
Figure 13B:
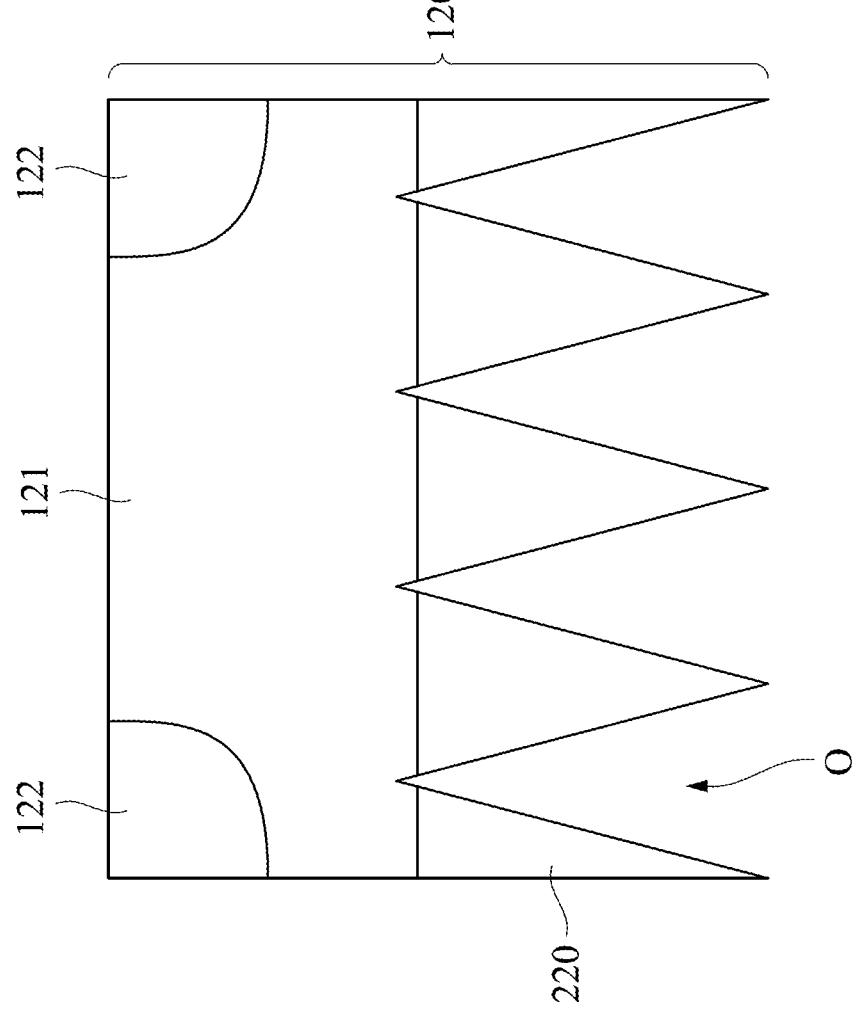
Figure 13C:
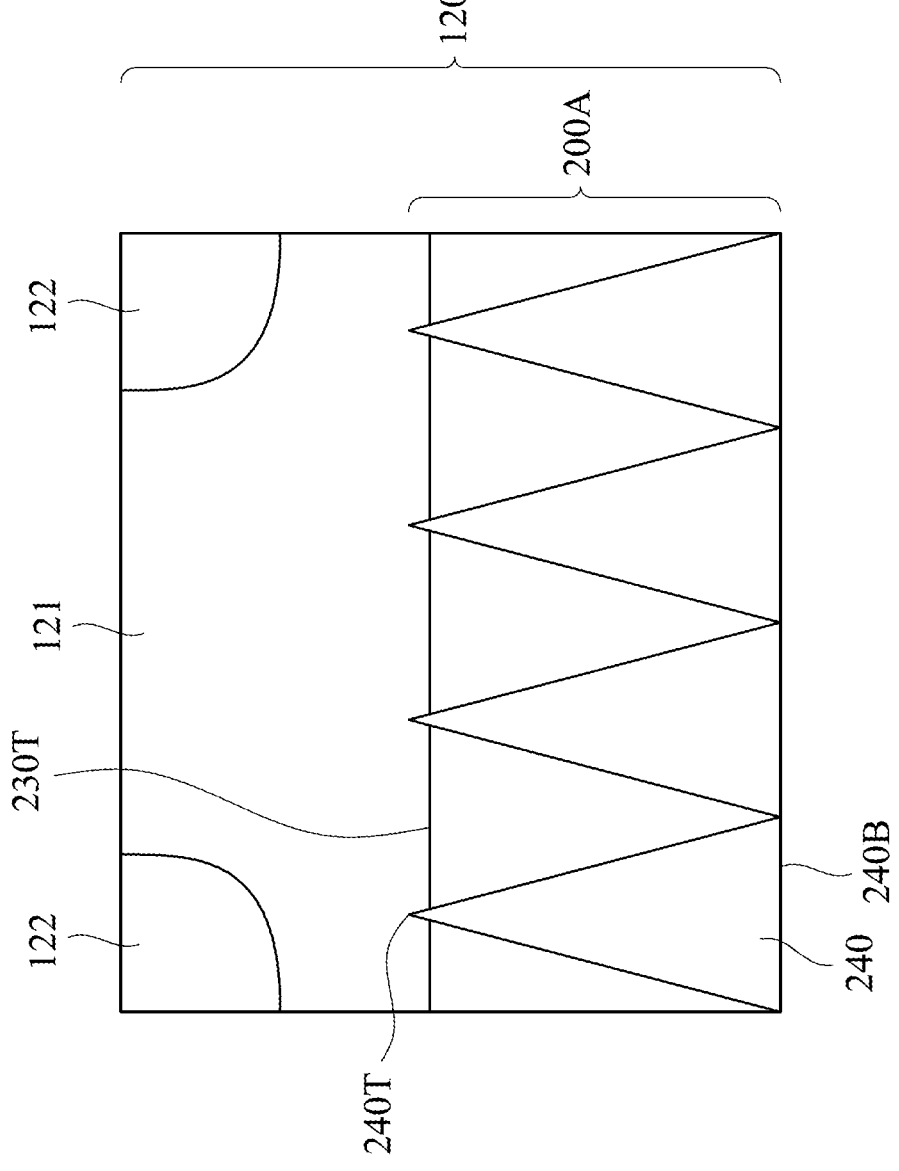

FIGS. 13A-13C illustrate a formation of the current spreading layer 200A in some other embodiments. Referring to FIG. 13A, an ion implantation is first performed to implant the dopants of the second semiconductor-type from the bottom of the epitaxial layer 120 to form the doped region 230 having the dopants of the second semiconductor-type. The detailed descriptions of FIG. 13A is shown as those of FIG. 12A and are not repeatedly described herein. Subsequently, referring to FIG. 13B, an etching process is performed to form openings O in the doped region 230. The depths of the openings O may be controlled, such that the openings O expose a portion of the drift region 121. Subsequently, referring to FIG. 13C, the conductive materials 240 are formed in the openings O, and the conductive materials 240 are in contact with the drift region 121. The shapes of the conductive materials 240 are determined by the shapes of the openings O. That is, the shapes of the conductive materials 240 are formed by forming the openings O with different shapes. In some embodiments, the bottoms of the openings O are connected together, so the bottoms 240B of the conductive materials 240 are connected together, as shown in FIGS. 2B and 13C. In some embodiment, the bottoms of the openings O are not connected together, so the bottoms of the conductive materials (such as conductive materials 250) are not connected together, as shown in FIG. 2C. The formation of the current spreading layer 200B in FIG. 2C is similar to that of the current spreading layer 200A. The difference between the two is that the shapes of the openings O are different, so the details are not repeatedly described herein.

Figure 14A:
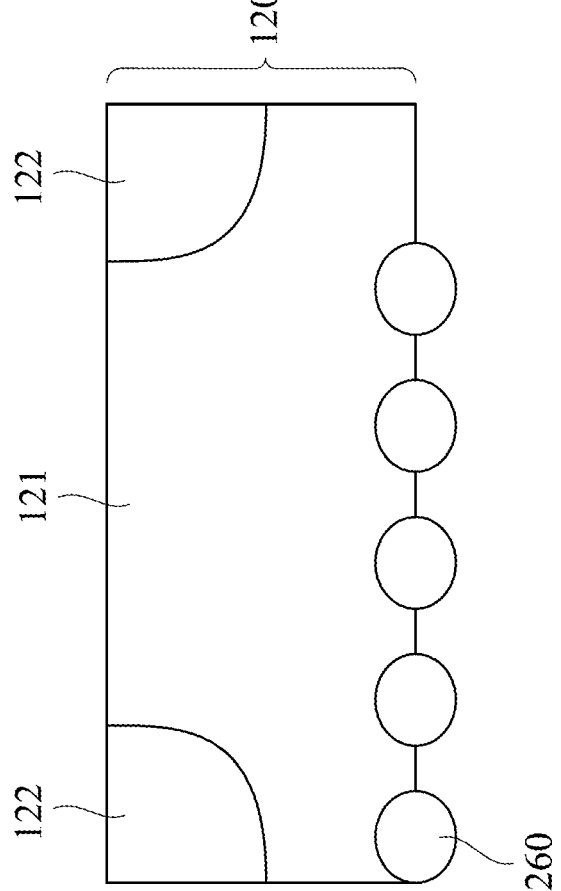
Figure 14B:
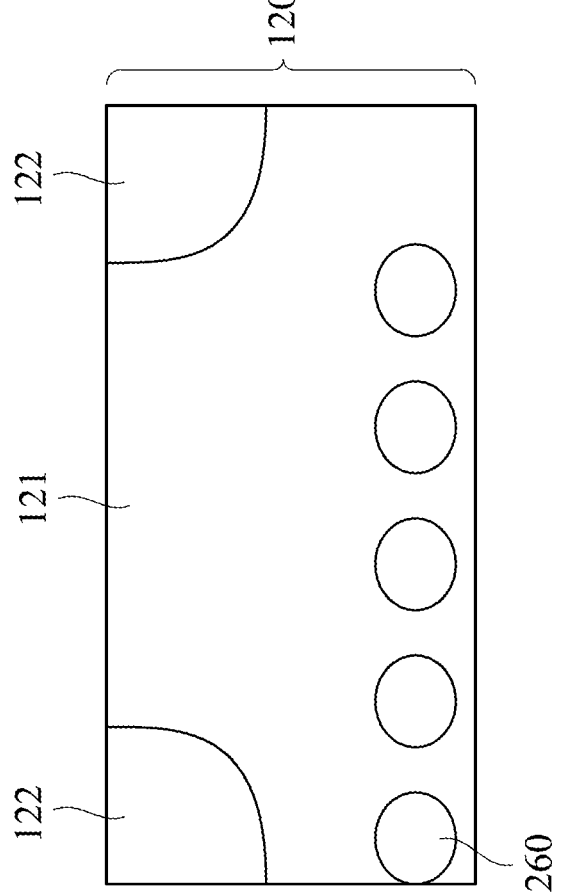
Figure 14C:
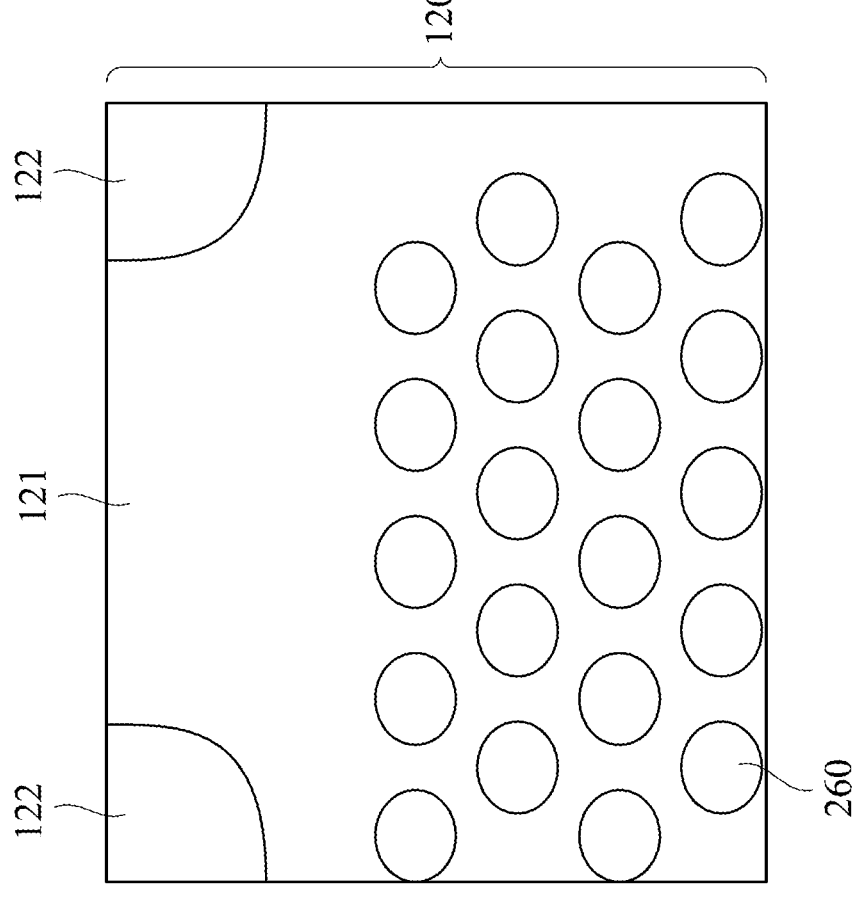
Figure 14D:
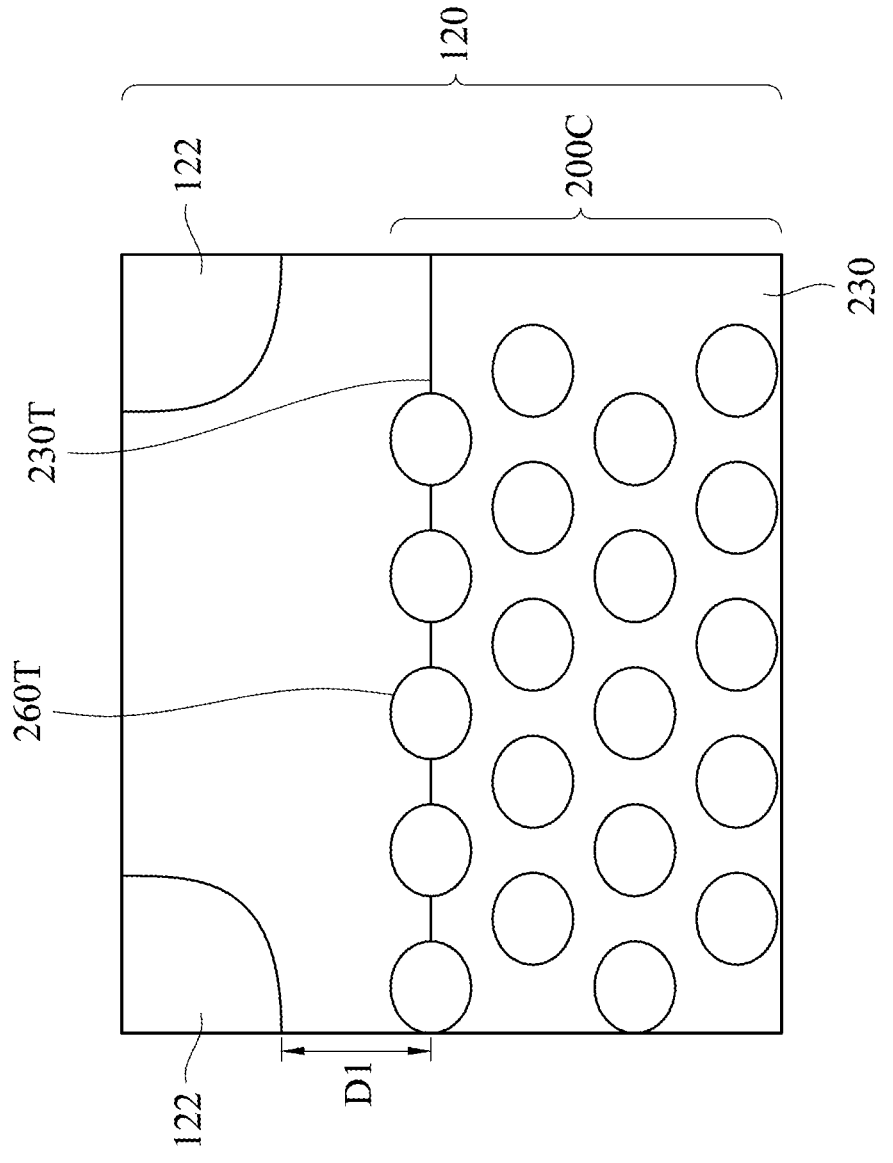

FIGS. 14A-14D illustrate a formation of the current spreading layer 200C in some other embodiments. Referring to FIG. 14A, a nanometer-sized metal particle solution is first coated on the surface of the epitaxial layer 120. The nanometer-sized metal particle solution includes the conductive materials 260, and the conductive materials 260 are evenly distributed on the surface of the epitaxial layer 120. A portion of the conductive materials 260 are exposed in the surroundings. Subsequently, referring to FIG. 14B, an epitaxial growth process is performed, so that the conductive materials 260 are covered by the epitaxial layer 120. The material and the semiconductor-type thereof deposited on the epitaxial layer 120 in FIG. 14A may be the same as those of the epitaxial layer 120, so that the material of the epitaxial layer 120 is consistent from bottom to top. Referring to FIG. 14C, the process of coating the nanometer-sized metal particle solution and the epitaxial growth process are repeated, so that the conductive materials 260 are arranged in rows in the epitaxial layer 120. Subsequently, referring to FIG. 14D, an ion implantation is performed to implant the dopants of the second semiconductor-type from the bottom of the epitaxial layer 120 to form the doped region 230 having the dopants of the second semiconductor-type at the bottom of the epitaxial layer 120. In some embodiments, a P-type ion implantation is performed to implant P-type dopants from the bottom of the epitaxial layer 120 to form the P-type doped region 230. The P-type doped region 230 may be heavily doped regions, such as the heavily doped regions including P-type dopants such as boron, gallium, etc. The doping intensity of the doped region 230 may be controlled, such that the top portions 260T of the conductive materials 260 protrude from the top portions 230T of the doped region 230. After forming the doped region 230, the distance D1 is between the doped region 230 and the well regions 122. In some embodiments, the distance D1 is in a range from 0.8 to 1.5 micrometers.

Figure 15A:
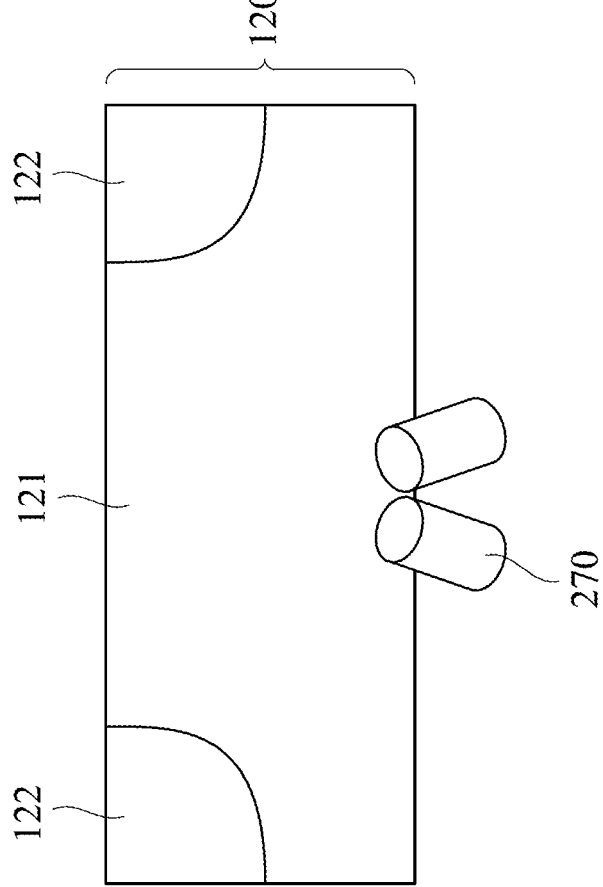
Figure 15B:
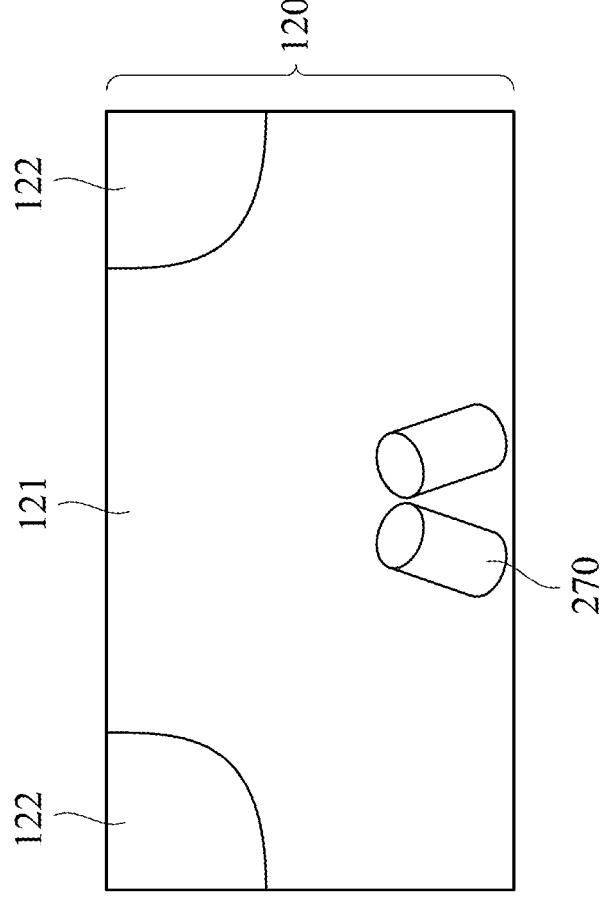

FIGS. 15A-15D illustrate a formation of the current spreading layer 200D in some other embodiments. Referring to FIG. 15A, the conductive materials 270 are grown on the surface of the epitaxial layer 120. The conductive materials

Figure 15C:
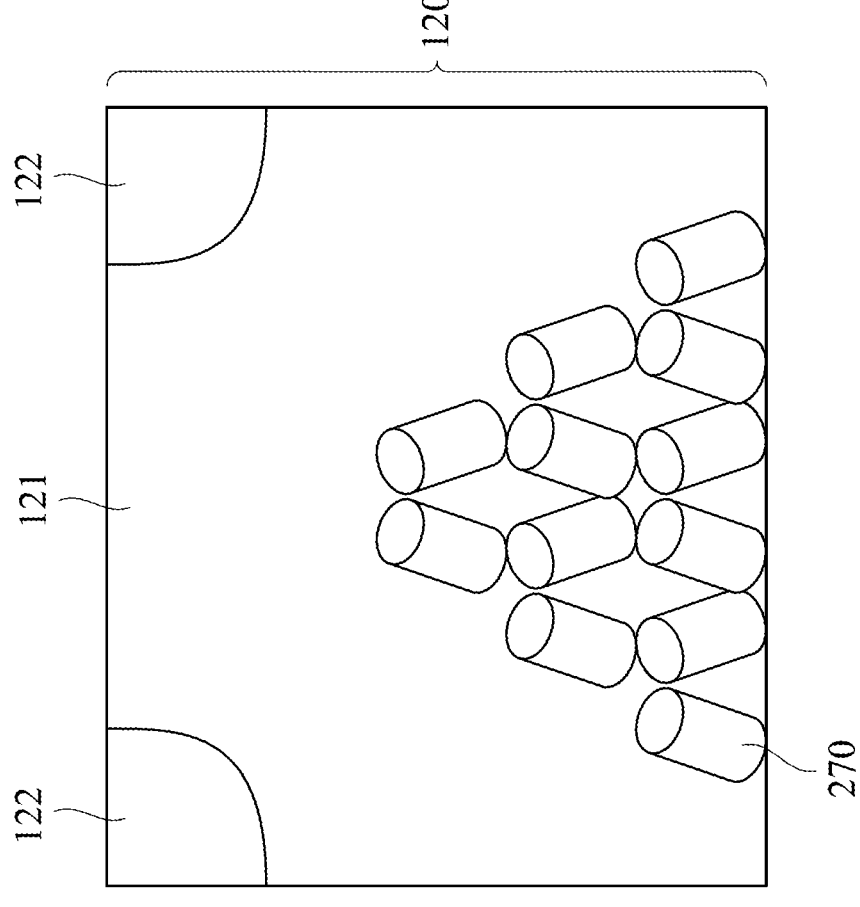
Figure 15D:
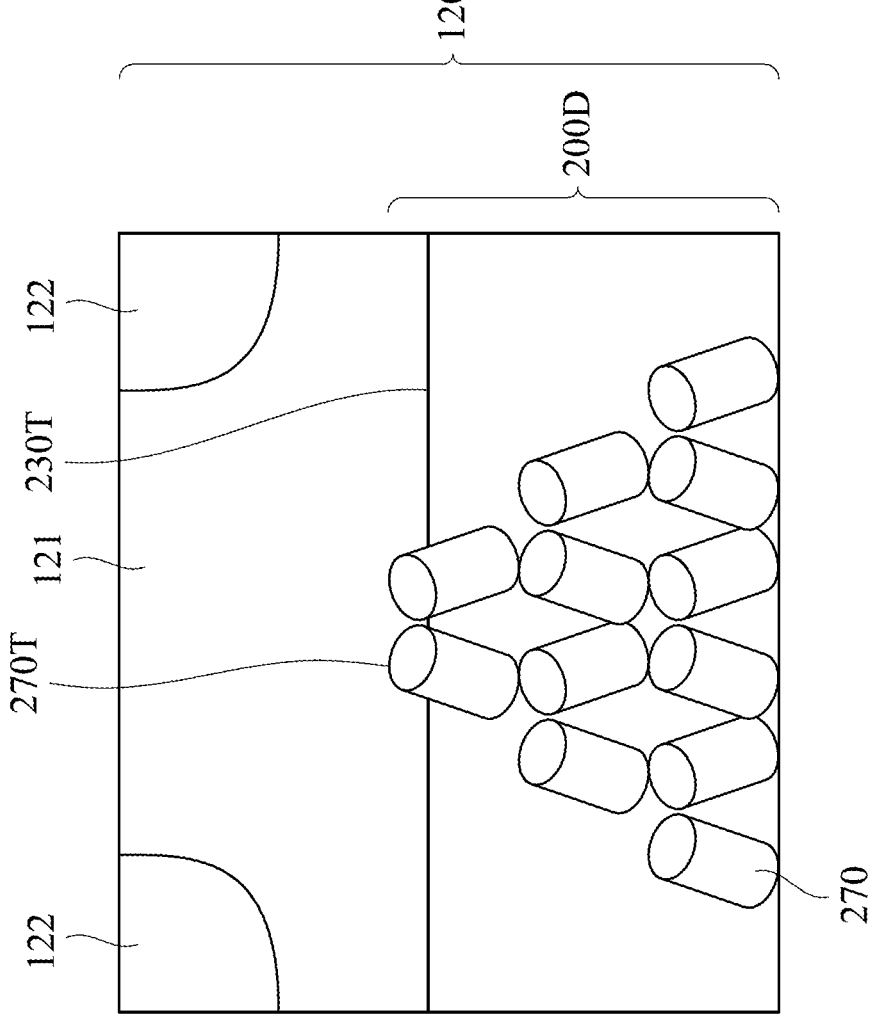

270 may be carbon nanotubes. The growth direction of the carbon nanotubes may be determined by the characteristics of the carbon nanotubes to be grown. The characteristics of the carbon nanotubes may include the more conductive parts of the carbon nanotubes. For example, when the more conductive parts of the carbon nanotubes are the interiors of the carbon nanotubes, the growth direction of the carbon nanotubes is inclined in regard with the surface of the epitaxial layer 120, as shown in FIG. 15A. Subsequently, referring to FIG. 15B, an epitaxial growth process is performed, so that the conductive materials 270 are covered by the epitaxial layer 120. The material and the semiconductor-type thereof deposited on the epitaxial layer 120 in FIG. 15A may be the same as those of the epitaxial layer 120, so that the material of the epitaxial layer 120 is consistent from bottom to top. Referring to FIG. 15C, the process of growing the conductive materials 270 and the epitaxial growth process are repeated, so that the conductive materials 270 are arranged in rows in the epitaxial layer 120. Subsequently, referring to FIG. 15D, an ion implantation is performed to implant the dopants of the second semiconductor-type from the bottom of the epitaxial layer 120 to form the doped region 230 having the dopants of the second semiconductor-type at the bottom of the epitaxial layer 120. The doping intensity of the doped region 230 may be controlled, such that the top portions 270T of the conductive materials 270 protrude from the top portions 230T of the doped region 230. The doped region 230 in FIG. 15D is shown as the doped region 230 in FIG. 14D, so the details are not repeatedly described herein.

The formation of the current spreading layer 200E in FIG. 2F is similar to that of the current spreading layer 200D. The difference is that the more conductive parts of the conductive materials 280 in FIG. 2F are the surfaces of the conductive materials 280, so the growth direction of the carbon nanotubes is horizontal in regard with the surface of the epitaxial layer 120.

Figure 16:
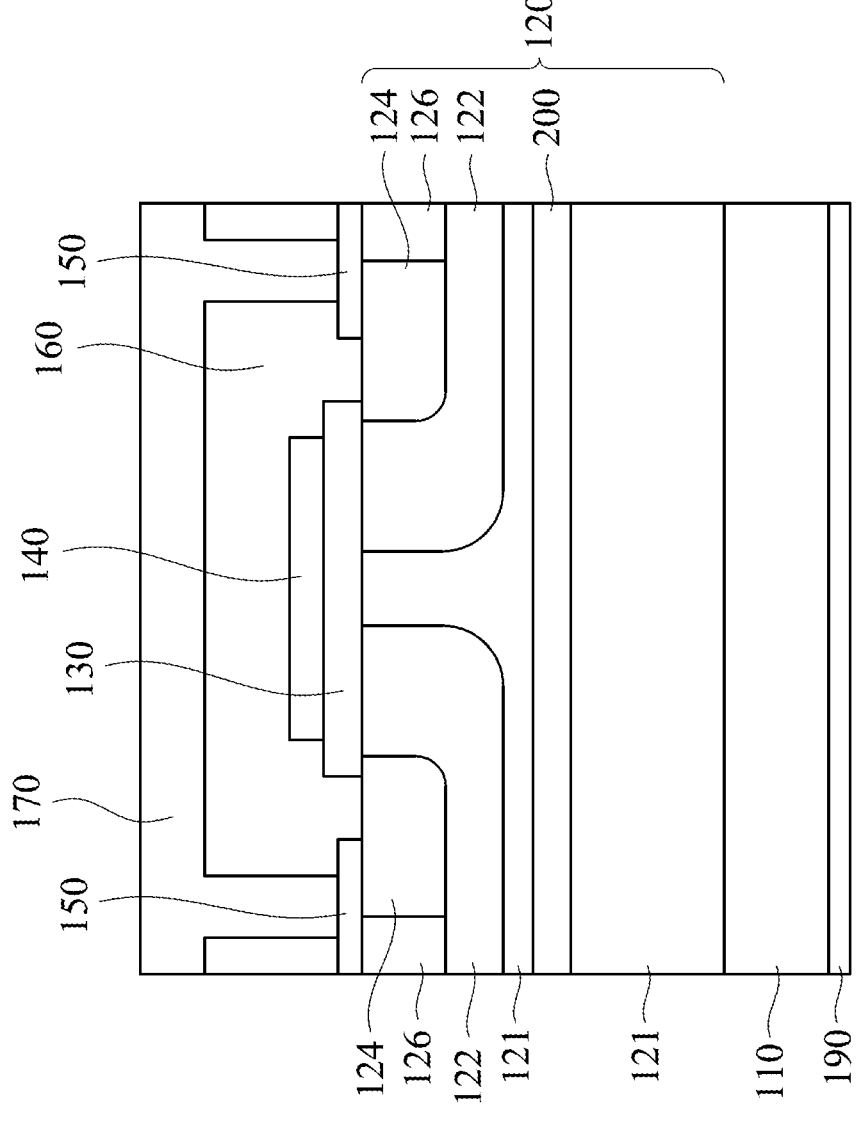

After forming the current spreading layer 200, referring to FIG. 16, the carrier 180 is removed. Subsequently, a replacement epitaxial layer and a replacement substrate are disposed at the bottom of the current spreading layer 200. The replacement epitaxial layer may be a lightly doped region including dopants of the first semiconductor-type. For example, the replacement epitaxial layer may serve as the drift region 121, and the replacement substrate may be the substrate 110 in FIG. 1. In some embodiments, the replacement epitaxial layer and the replacement substrate are formed in advance. After forming the current spreading layer 200, the replacement epitaxial layer and the replacement substrate are directly placed under the current spreading layer 200. Subsequently, the drain electrode 190 is formed under the replacement substrate (i.e. the substrate 110).

As mentioned above, the semiconductor device in some embodiments of the present disclosure includes the current spreading layer. The current spreading layer may be used to expand the restricted area of the electron flow to increase the overall current. Many methods, such as ion doped regions, metal or carbon nanotubes, are used to disperse the flowing range of the electron flow. As such, the power conversion efficiency of the semiconductor device is enhanced.

It is to be understood, however, that even though numerous characteristics and advantages of the present invention have been set forth in the foregoing description, together with details of the structure and function of the invention, and changes may be made in detail, especially in matters of shape, size, and arrangement of parts within the principles of the invention to the full extent indicated by the broad general meaning of the terms in which the appended claims are expressed.

What is claimed is:

1. A semiconductor device, comprising:
a substrate;
an epitaxial layer on the substrate;
a well region in the epitaxial layer;
a current spreading layer in the epitaxial layer and below the well region, wherein the current spreading layer comprises a plurality of first doped regions and a plurality of second doped regions, the first doped regions comprises a plurality of dopants of a first semiconductor-type, the second doped regions comprises a plurality of dopants of second semiconductor-type, and the second semiconductor-type is different from the first semiconductor-type, and a plurality of top portions of the first doped regions upwardly protrude from a plurality of top portions of the second doped regions;
a source region in the well region;
a base region in the well region and adjacent to the source region; and
a gate layer over the epitaxial layer.

2. The semiconductor device of claim 1, wherein a distance is between the second doped regions and the well region.

3. The semiconductor device of claim 1, wherein widths of the first doped regions decrease as getting close to the well region.

4. The semiconductor device of claim 1, wherein a plurality of bottom portions of the first doped regions are leveled with a plurality of bottom portions of the second doped regions.

5. A semiconductor device, comprising:
a substrate;
an epitaxial layer on the substrate, wherein the epitaxial layer comprises a drift region, and the drift region has a plurality of dopants of a first semiconductor-type;
a well region in the epitaxial layer and cladded by the epitaxial layer;
a current spreading layer in the epitaxial layer, wherein compared to the substrate, the current spreading layer is closer to the well region, the current spreading layer comprises a doped region having a plurality of dopants of a second semiconductor-type and a plurality of conductive materials, the conductive materials are arranged in the doped region;
a source region in the well region;
a base region in the well region; and
a gate layer over the current spreading layer.

6. The semiconductor device of claim 5, wherein the conductive materials are a plurality of metals.

7. The semiconductor device of claim 5, wherein the conductive materials are a plurality of carbon nanotubes.

8. The semiconductor device of claim 5, wherein a distance is between the conductive materials in adjacent positions.

9. The semiconductor device of claim 5, wherein a top portion of at least one of the conductive materials upwardly protrudes from a top portion of the doped region.

* * * * *